United States Patent
Li et al.

(10) Patent No.: US 10,467,965 B2
(45) Date of Patent: Nov. 5, 2019

(54) PIXEL CIRCUIT, METHOD FOR DRIVING THE SAME, OLED PANEL, AND DISPLAY DEVICE

(71) Applicant: SHANGHAI TIANMA AM-OLED CO., LTD., Shanghai (CN)

(72) Inventors: Yue Li, Shanghai (CN); Renyuan Zhu, Shanghai (CN); Dongxu XiAng, Shanghai (CN); Yana Gao, Shanghai (CN); Zeyuan Chen, Shanghai (CN); Zhonglan Cai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 12 days.

(21) Appl. No.: 15/864,731

(22) Filed: Jan. 8, 2018

(65) Prior Publication Data

US 2018/0151123 A1    May 31, 2018

(30) Foreign Application Priority Data

Jul. 31, 2017 (CN) .......................... 2017 1 0644125

(51) Int. Cl.
| | |
|---|---|
| *G09G 3/3258* | (2016.01) |
| *H01L 51/52* | (2006.01) |
| *G09G 3/3233* | (2016.01) |
| *H01L 27/32* | (2006.01) |

(52) U.S. Cl.
CPC ......... *G09G 3/3258* (2013.01); *G09G 3/3233* (2013.01); *H01L 51/5203* (2013.01); *G09G 2300/0819* (2013.01); *G09G 2300/0842* (2013.01); *G09G 2300/0861* (2013.01); *G09G 2320/0214* (2013.01); *H01L 27/3244* (2013.01)

(58) Field of Classification Search
CPC .............. G09G 3/3258; H01L 51/5203; H01L 27/3244
See application file for complete search history.

(56) References Cited

U.S. PATENT DOCUMENTS

| | | | |
|---|---|---|---|
| 2016/0224157 A1* | 8/2016 | Yang | G09G 3/3233 |
| 2016/0232836 A1* | 8/2016 | Yang | G09G 3/3233 |
| 2016/0233281 A1* | 8/2016 | Yoon | H01L 27/3262 |
| 2017/0103706 A1* | 4/2017 | Yang | G06F 3/0416 |
| 2018/0033370 A1* | 2/2018 | Zheng | G09G 3/3233 |
| 2018/0151123 A1* | 5/2018 | Li | G09G 3/3233 |
| 2018/0151650 A1* | 5/2018 | Ha | H01L 27/1214 |

* cited by examiner

*Primary Examiner* — Carolyn R Edwards
(74) *Attorney, Agent, or Firm* — Alston & Bird LLP

(57) ABSTRACT

Disclosed are a pixel circuit and method for driving the same, an organic light emitting display panel and a display device. Prior to the data signal is written into the control electrode of the driving transistor, a unified common voltage signal is input to the first electrode of the driving transistor. The common voltage signal, along with a threshold voltage of the driving transistor, is written into the control electrode of the driving transistor. It can be ensured that each time the data signal is written to the control electrode of the driving transistor, voltages of the control electrode and the first electrode of the driving transistor can jump by a unified potential, so as to avoid the variation of the voltage change in the control electrode which came as a result of the parasitic capacitance between the control electrode and the first electrode of the driving transistor.

16 Claims, 16 Drawing Sheets

US 10,467,965 B2

PIXEL CIRCUIT, METHOD FOR DRIVING THE SAME, OLED PANEL, AND DISPLAY DEVICE

CROSS REFERENCE TO RELATED APPLICATION

This application claims priority to Chinese Patent Application No. CN201710644125.1, filed with the Chinese Patent Office on Jul. 31, 2017. The entire disclosure of the above application is incorporated herein by reference.

FIELD

The present invention relates to the field of display technologies, particularly to a pixel circuit and a driving method thereof, an organic light emitting display panel and a display device.

BACKGROUND

An Organic Light-Emitting Diode (OLED) display is one of focuses in the research field of displays at present time. OLED has low power consumption, a low production cost, self-light-emission, a wide angle of view, a high response speed, and other advantages as compared with a Liquid Crystal Display (LCD). OLED screens have come to take the place of the traditional LCD screens in the display fields of mobile phones, Personal Digital Assistants (PDA), digital cameras, etc., where design of pixel circuits are a core technology in the OLED display, and a research thereon is of great significance.

An existing pixel circuit structure, as shown in FIG. 1, includes six transistors: M01~M06, one driving transistor M0 and one capacitor C0. FIG. 2 shows an input timing diagram corresponding to the pixel circuit as shown in FIG. 1. Such pixel circuit can be used to address the problem of uneven display due to drift of the threshold voltage of the driving transistor M0 which results from some different technologies or aging of the transistors by its internally compensation mechanism, but there still exists a problem of brightness inconsistency in the first frame after switching between high and low gray scales. Moreover, after the pixel circuit has been used for light emitting for some period, because a bias stress may cause the occurrence of a shift in the threshold voltage of the driving transistor, hysteresis effect may happen due to different influences from the drift variation, further causing the occurrence of ghosting image.

SUMMARY

The embodiments of the present disclosure provide a pixel circuit and driving method thereof, an organic light emitting display panel and a display device, for solving the problems of the ghosting images existing in the prior art pixel circuit and brightness inconsistency in the first frame after switching between high and low grayscales.

An embodiment of the disclosure provides a pixel circuit. The pixel circuit includes a voltage writing module, an initialization module, a compensation control module, a light emitting control module, a driving transistor and a light emitting element. The voltage writing module is connected to a first control signal terminal, a second control signal terminal, a common voltage signal terminal, a data signal terminal and a first electrode of the driving transistor respectively, and is configured to provide a common voltage signal from the common voltage signal terminal to the first electrode of the driving transistor under control of a signal of the first control signal terminal, to provide a data signal from the data signal terminal to the first electrode of the driving transistor under control of a signal of the second control signal terminal; where the voltage of the data signal is not less than that of the common voltage signal. The initialization module is connected to a first scan signal terminal, a reference signal terminal and the driving transistor respectively, and is configured to initialize the driving transistor under control of a signal of the first scan signal terminal. The compensation control module is connected to a second scan signal terminal, a control electrode of the driving transistor and a second electrode of the driving transistor respectively, and is configured to connect the control electrode of the driving transistor to the second electrode of the driving transistor under control of a signal of the second scan signal terminal. The light emitting control module is connected to a light emitting control signal terminal, a first power supply terminal, a first electrode of the driving transistor, a second electrode of the driving transistor and a first terminal of the light emitting element respectively, and is configured to drive the light emitting element through the driving transistor under control of a signal of the light emitting control signal terminal.

An embodiment of the present disclosure further provides an organic light emitting display panel. The organic light emitting display panel includes the pixel circuit according to the above embodiment of the present disclosure.

An embodiment of the present disclosure further provides a display device. The display device includes the organic light emitting display panel according to the above embodiment of the present disclosure.

An embodiment of the present disclosure further provides a method for driving the pixel circuit according to the embodiment of the present disclosure. The method includes: an initialization stage, a common voltage writing stage, a data voltage writing stage and a light emitting stage. In the initialization stage, a first level signal is provided to the first scan signal terminal, and a second level signal is provided to the second scan signal terminal, the first control signal terminal, the second control signal terminal and the light emitting control signal terminal. In the common voltage writing stage, the first level signal is provided to the second scan signal terminal and the first control signal terminal, and the second level signal is provided to the first scan signal terminal, the second control signal terminal and the light emitting control signal terminal. In the data voltage writing stage, the first level signal is provided to the second scan signal terminal and the second control signal terminal, and the second level signal is provided to the first scan signal terminal, the first control signal terminal and the light emitting control signal terminal. In the light emitting stage, the first level signal is provided to the light emitting control signal terminal, and the second level signal is provided to the first scan signal terminal, the second scan signal terminal, the first control signal terminal and the second control signal terminal.

DETAILED DESCRIPTION OF THE EMBODIMENTS

Figure 1:
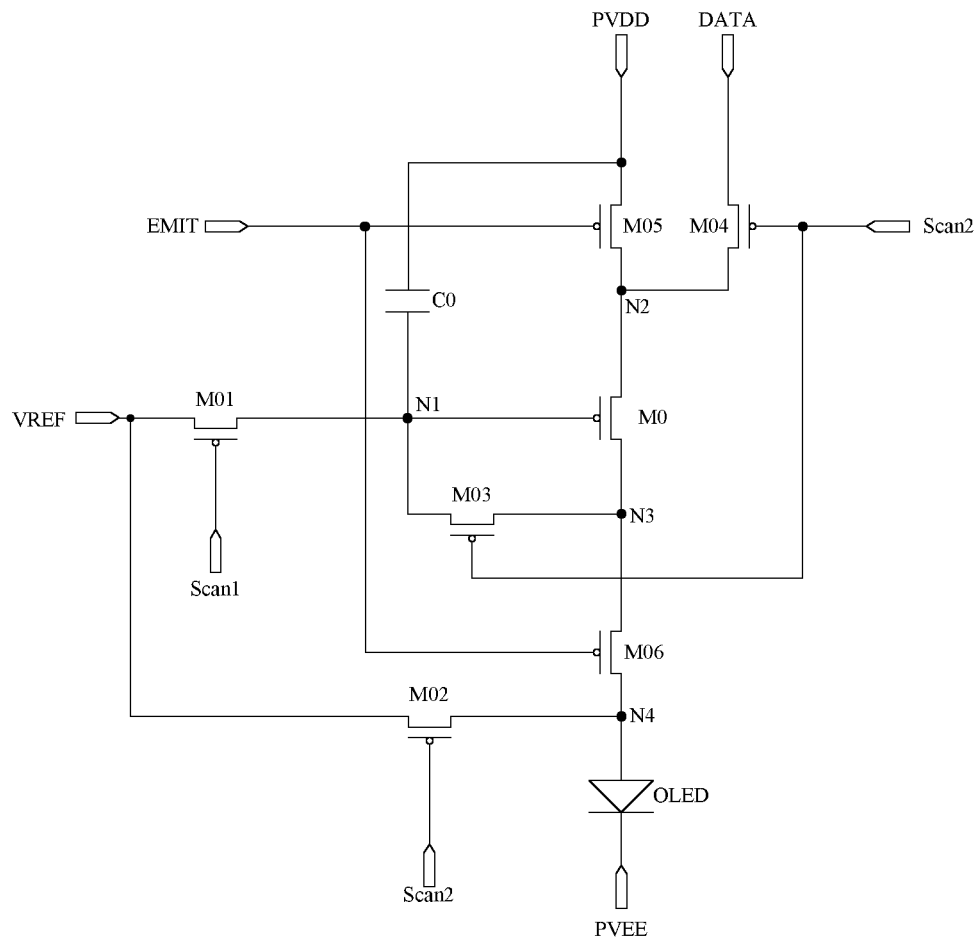
FIG. 1 shows a schematic scheme diagram of a pixel circuit in the related art.
Figure 2:
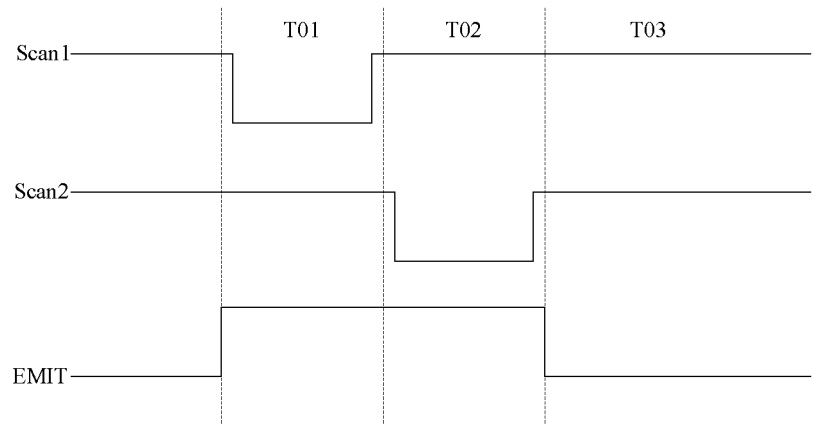
FIG. 2 shows an input timing diagram corresponding to the pixel circuit shown in FIG. 1.

Consider an analogue simulation of the pixel circuit shown in FIG. 1, when the grayscale value of the (n−1)th frame is 0, the grayscale value of the n-th frame is 255 and grayscale value of the (n+1)th frame is 255, the potentials of a first node N1 and a second node N2 in different time stages are measured and the measured results are shown in the following table 1.

TABLE 1

| | Gray-scale value | | | | | |
| --- | --- | --- | --- | --- | --- | --- |
| | 0 | 255 | | | 255 | |
| | | Frame number | | | | |
| | (n − 1)th frame | n-th frame | | | (n + 1)th frame | |
| Stage | T03 | T01 | T02 | T03 | T01 | T02 |
| N1 | 3.44 | −3 | 1.03 | 1.5 | −3 | 1.02 |
| N2 | 4.6 | −0.65 | 3.5 | 4.6 | 0.15 | 3.5 |

It can be seen from the above table 1 that, in an initialization stage, the potential of the second node N2 in the n-th frame is different from that of the second node N2 in the (n+1)th frame. This is because in the initialization stage, the potential of the first node N1 in the n-th frame is switched to −3V from 3.44V and the potential of the first node N1 in the (n+1)th frame is switched to −3V from 1.5V. Since there exists parasitic capacitance between the first node N1 and the second node N2 in the pixel circuit, and the second node N2 is floating during the initialization stage, the voltage change ΔV of the first node N1 is not consistent, so that during the initialization stage, the potential of the second node N2 in the n-th frame is different from that of the second node N2 in the (n+1)th frame. As a result, during the data writing stage, the potential of the first node N1 in the n-th frame is also different from that of the first node N1 in the (n+1)th frame, thus resulting in the problem of brightness inconsistency between the n-th frame and the (n+1)th frame. Moreover, after the pixel circuit has been used for light emitting for some period, because the bias stress may cause the occurrence of the shift in the threshold voltage of the driving transistor, hysteresis effect may happen due to different influences from the shift variation, further causing the occurrence of ghosting image.

In view of this, an embodiment of the present disclosure provides a pixel circuit and a method for driving the same, an organic light emitting display panel and a display device, in which before a data signal is input, a unified common voltage signal is input to the second node N2, so that the potential of the second node N2 can jump by a unified potential; and meanwhile the threshold voltage can be captured at the first node N1 and a large current can pass the driving transistor, thus reducing the writing time of the data signal, alleviating the hysteresis effect of the driving transistor and avoiding the problem of brightness inconsistence.

In order to make the objects, technical solutions, and advantages of the disclosure more apparent, particular implementations of the pixel circuit, the method for driving the same, the organic light emitting display panel, and the display device according to the embodiments of the disclosure will be described below in details with reference to the drawings. It shall be noted that the preferred embodiments to be described below are merely intended to illustrate and explain the disclosure, but not to limit the disclosure thereto; and the embodiments of the disclosure, and the features in the embodiments can be combined with each other unless they conflict with each other.

Figure 3A:
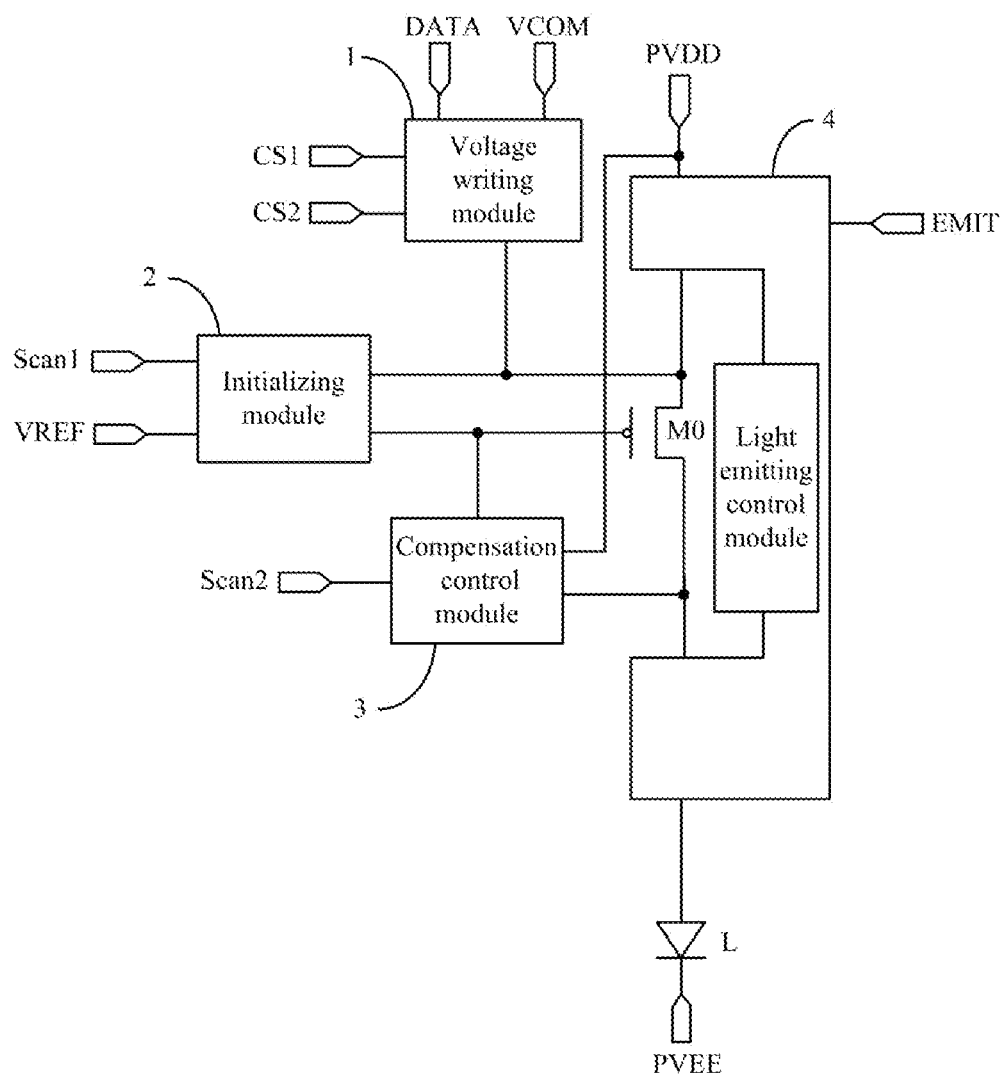
FIG. 3A shows a schematic scheme diagram of a pixel circuit according to an embodiment of the present disclosure.

The pixel circuit according an embodiment of the present disclosure, as shown in FIG. 3A, includes a voltage writing module 1, an initialization module 2, a compensation control module 3, a light emitting control module 4, a driving transistor M0 and a light emitting element L.

The voltage writing module 1 is connected to a first control signal terminal CS1, a second control signal terminal CS2, a common voltage signal terminal VCOM, a data signal terminal DATA and a first electrode of the driving transistor M0 respectively. The voltage writing module 1 is configured to provide a common voltage signal from the common voltage signal terminal VCOM to the first electrode of the driving transistor M0 under control of a signal of the first control signal terminal CS1, and to provide a data signal from the data signal terminal DATA to the first electrode of the driving transistor M0 under control of a signal of the second control signal terminal CS2; here the voltage of the data signal is not less than that of the common voltage signal.

The initialization module 2 is connected to a first scan signal terminal Scan1, a reference signal terminal VREF and the driving transistor M0 respectively, and is configured to initialize the driving transistor M0 under control of a signal of the first scan signal terminal Scan1.

The compensation control module 3 is connected to a second scan signal terminal Scan2, a control electrode of the driving transistor M0 and a second electrode of the driving transistor M0 respectively, and is configured to electrically connect the control electrode of the driving transistor M0 to the second electrode thereof under control a signal of the second scan signal terminal Scan2.

The light emitting control module 4 is connected to a light emitting control signal terminal EMIT, a first power supply terminal PVDD, a first electrode of the driving transistor M0, a second electrode of the driving transistor M0 and a first terminal of the light emitting element L. The light emitting control module 4 is configured to drive the light emitting element L, through the driving transistor M0 and under control of the light emitting control signal terminal EMIT, to emit the light.

In the pixel circuit according to an embodiment of the present disclosure, before the data signal is written into the control electrode of the driving transistor, a unified common voltage signal is input to the first electrode of the driving transistor, and the common voltage signal along with a threshold voltage of the driving transistor are written into the control electrode of the driving transistor. It can be ensured that each time the data signal is written to the control electrode of the driving transistor, voltages of the control electrode and the first electrode of the driving transistor can jump by a unified potential, so as to avoid the variation of the voltage change of the control electrode resulting from the parasitic capacitance between the control electrode and the first electrode of the driving transistor, thus the problem of the inconformity of threshold voltage captures due to the voltage jump can be avoided and therefore consistent brightness in the first frame after switching between high and low gray scales can be guaranteed. Furthermore, each time before the data signal is written to the control electrode of the driving transistor, the threshold voltage can be captured at the control electrode of the driving transistor, to thereby reduce the writing time of the data signal. Furthermore, during the process that the common voltage signal is written to the control electrode of the driving transistor, a large current can pass through the driving transistor, so as to correct the threshold voltage shift of the driving transistor due to the bias stress, alleviate the hysteresis effect of the driving transistor and thus avoid the occurrence of the ghosting image.

In a particular implementation, in the pixel circuit according to an embodiment of the disclosure, the initialization module may only be connected to the control electrode of the driving transistor, for initializing the control electrode of the driving transistor under control of the signal of the first scan signal terminal. Alternatively, as shown in FIG. 3A, the initialization module 2 may be connected to the control electrode of the driving transistor M0 and the first electrode of the driving transistor M0 respectively, for initializing both of the control electrode of the driving transistor M0 and the first electrode of the driving transistor M0 under control of the signal of the first scan signal terminal Scan1. In this way, the control electrode and the first electrode of the driving transistor can be reset at the same time, so as to avoid the written common voltage signal from being affected by the variation of the voltage change of the control electrode resulting from the parasitic capacitance between the control electrode and the first electrode of the driving transistor, further avoid the problem of the inconformity of threshold voltage captures due to the voltage jump and further guarantee brightness consistency of the first frame after switching between high and low gray scale.

Figure 3B:
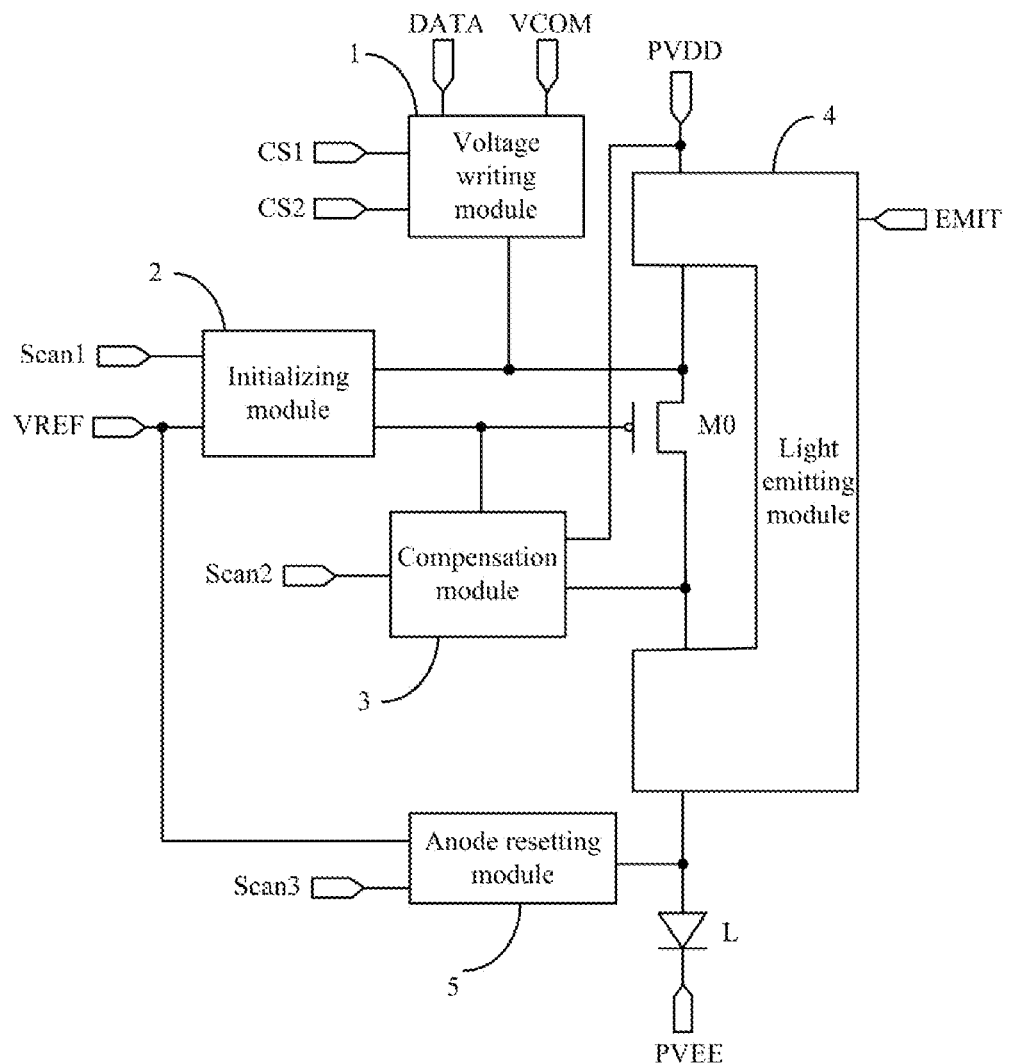
FIG. 3B shows a schematic scheme diagram of a pixel circuit according to another embodiment of the present disclosure.

Further, to remove the influence of the light emitting signal of the previous frame remaining in the light emitting element on light emission of the current frame, the pixel circuit according to an embodiment of the present disclosure may further include an anode resetting module 5, as shown in FIG. 3B.

The anode resetting module 5 is connected to a third scan signal terminal Scan3, the reference signal terminal VREF and a first terminal of the light emitting element L respectively, for resetting the signal of the first terminal of the light emitting element L under control of the signal of the third scan signal terminal Scan3. In this way, the light emitting element is allowed to be reset before the current frame starts to be scanned, thus removing the influence of light emitting for the previous frame on the light emitting for the current frame.

In a particular implementation, in the pixel circuit according to an embodiment of the preset disclosure, as shown in FIGS. 3A and 3B, the second terminal of the light emitting element L is connected to a second power supply terminal PVEE, and the voltage of the second power supply terminal PVEE is generally negative or grounding.

To simplify the setting of signal lines, save the number of the signal ports, save wiring space, in a pixel circuit according to an embodiment of the present disclosure, the first control signal terminal and the second control signal terminal may be the same signal terminal.

To simplify the setting of signal lines, save the number of the signal ports, save wiring space, in a pixel circuit according to an embodiment of the present disclosure, the third scan signal terminal and the first scan signal terminal may be the same signal terminal.

Alternatively, in one or more embodiment, the third scan signal terminal and the second scan signal terminal may also be the same signal terminal.

Alternatively, in one or more embodiment, the third scan signal terminal and the first control signal terminal may also be the same signal terminal.

Alternatively, in one or more embodiment, the third scan signal terminal and the second control signal terminal may also be the same signal terminal.

Alternatively, in one or more embodiment, the third scan signal terminal and the light emitting control signal terminal are the same signal terminal.

The present disclosure will be described below in detail in connection with specific embodiments. It should be noted that the embodiments below are for better explanation and no limitation of the present invention.

In a specific implementation, in a pixel circuit according to an embodiment of the present disclosure, as shown in FIG. 3A to FIG. 5I, the driving transistor M0 is a P-type transistor, the control electrode of the driving transistor M0 is connected to the first node N1, its first electrode is connected to the second node N2 and its second electrode is connected to the third node N3. For the case where the driving transistor is an N-type transistor, the design principle is the same as that of the present disclosure and also falls within the protection scope of the present disclosure.

In a specific implementation, in a pixel circuit according to an embodiment of the present disclosure, the light emitting element is generally an organic light emitting diode; wherein the positive electrode of the organic light emitting diode is the first terminal of the light emitting element; and the negative electrode is the second terminal of the light emitting element. Of course, the light emitting element may be other elements which have a light emitting function, and no limitation is made thereto.

In a specific implementation, in a pixel circuit according to an embodiment of the present disclosure, as shown in FIG. 4A to FIG. 5I, the voltage writing module 1 may include a first transistor M1 and a second transistor M2.

The first transistor M1 has a control electrode connected to the first control signal terminal CS1, a first electrode connected to the common voltage signal terminal VCOM, and a second electrode connected to the first electrode of the driving transistor M0.

The second transistor M2 has a control electrode connected to the second control signal terminal CS2, a first electrode connected to the data signal terminal DATA, and a second electrode connected to the first electrode of the driving transistor M0.

Figure 4A:
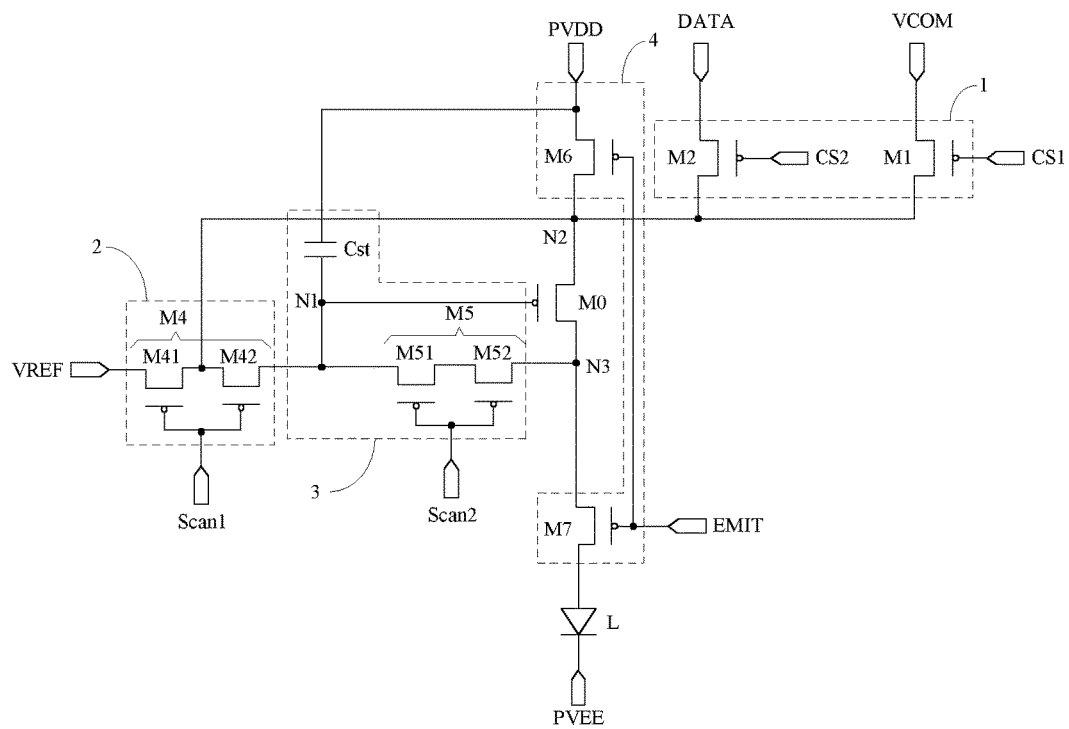
FIG. 4A shows a detailed structural diagram of the pixel circuit shown in FIG. 3A.
Figure 5A:
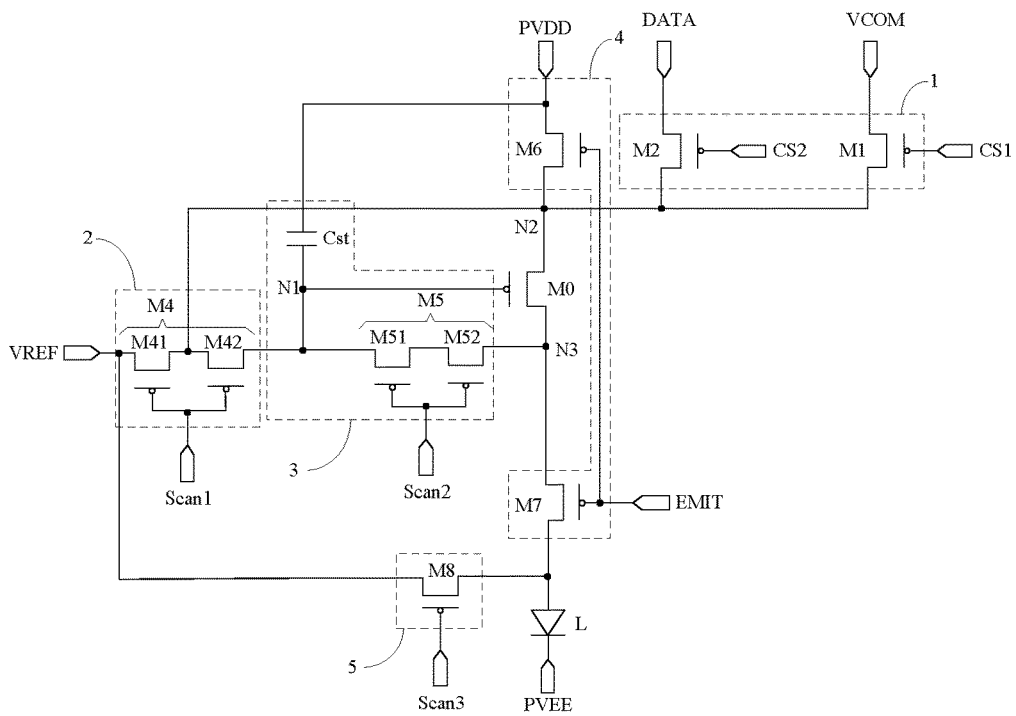
FIG. 5A shows a detailed structural diagram of the pixel circuit shown in FIG. 3B.
Figure 5B:
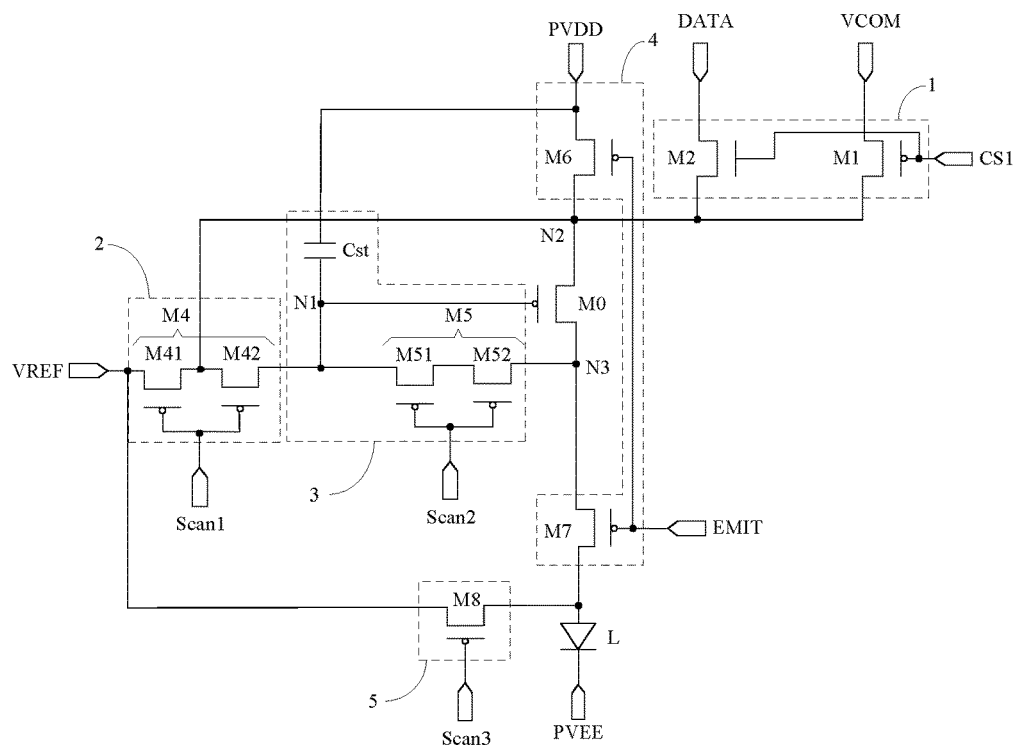
FIG. 5B shows another detailed structural diagram of the pixel circuit shown in FIG. 3B.
Figure 5C:
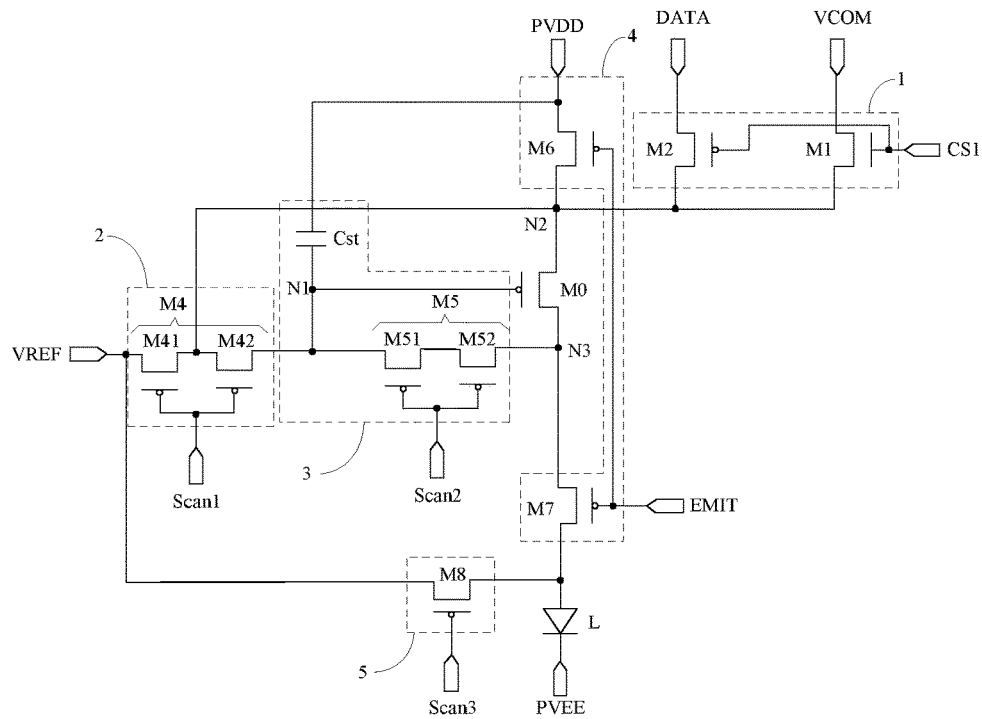
FIG. 5C shows further another detailed structural diagram of the pixel circuit shown in FIG. 3B.

In a specific implementation, in a pixel circuit according to an embodiment of the present disclosure, as shown in FIG. 4A and FIG. 5A, the first transistor M1 and the second transistor M2 may be a P-type transistor. Of course, the first transistor and the second transistor may also be N-type transistors, and no limitation is made thereto.

In a specific implementation, in a pixel circuit according to an embodiment of the present disclosure, when the first transistor is switched on under control of a signal from the first control signal terminal, a common voltage signal may be provided to the first electrode of the driving transistor. When the second transistor is switched on under control of a signal from the second control signal terminal, a data signal may be provided to the first electrode of the driving transistor; where the first transistor is switched on before the second transistor is.

In a specific implementation, in a pixel circuit according to an embodiment of the present disclosure, the first control signal terminal and the second control signal terminal may be the same signal terminal. For example, as shown in FIG. 4B to FIG. 4E and FIG. 5B to FIG. 5I, the control electrode of the first transistor M1 and the control electrode of the second transistor M2 may be connected to the first control signal terminal CS1. Moreover, as shown in FIG. 4B, FIG. 4D, FIG. 5B, FIG. 5D and FIG. 5F to FIG. 5I, the first transistor M1 may be a P-type transistor, and the second transistor M2 may be a N-type transistor. Alternatively, as shown in FIG. 4C, FIG. 4E, FIG. 5C and FIG. 5E, the first transistor M1 may be a N-type transistor, and the second transistor M2 may be a P-type transistor. Of course, the control electrode of the first transistor and the control electrode of the second transistor may both be connected to the second control signal terminal, and no limitation is made thereto.

If the first control signal terminal and the second control signal terminal are the same signal terminal, in a specific implementation, in a pixel circuit according to an embodiment of the present disclosure, as shown in FIG. 4D, FIG. 4E and FIG. 5D to FIG. 5I, the voltage writing module 1 may further include a third transistor M3.

The second electrode of the second transistor M2 is connected to the first electrode of the driving transistor M0 via the third transistor M3, the control electrode of the third transistor M3 is connected to the second scan signal terminal Scan2, the first electrode of the third transistor M3 is connected to the second electrode of the second transistor M2, and the second electrode of the third transistor M3 is connected to the first electrode of the driving transistor M0.

In a specific implementation, in a pixel circuit according to an embodiment of the present disclosure, as shown in FIG. 4D, FIG. 4E and FIG. 5D to FIG. 5I, the third transistor M3 may be a P-type transistor. Alternatively, the third transistor may be a N-type transistor, and no limitation is made thereto.

In a specific implementation, in a pixel circuit according to an embodiment of the present disclosure, when the third transistor is switched on under control of a signal from the second scan signal terminal, the second electrode of the second transistor may be connected with the first electrode of the driving transistor. In a specific implementation, in a pixel circuit according to an embodiment of the present disclosure, as shown in FIG. 4A to FIG. 5I, the initialization module 2 may include a fourth transistor M4. The fourth transistor M4 has a control electrode connected to the first scan signal terminal Scan1, a first electrode connected to the reference signal terminal VREF, and a second electrode connected to the control electrode of the driving transistor M0.

In a specific implementation, in a pixel circuit according to an embodiment of the present disclosure, as shown in FIG. 4A to FIG. 5I, the fourth transistor M4 may be a P-type transistor; alternatively, the fourth transistor may be a N-type transistor, and no limitation is made thereto.

In a specific implementation, in a pixel circuit according to an embodiment of the present disclosure, when the fourth transistor is switched on under control of a signal from the first scan signal terminal, a reference voltage signal may be provided to the control electrode of the driving transistor to initialize the control electrode of the driving transistor.

In a specific implementation, in a pixel circuit according to an embodiment of the present disclosure, as shown in FIG. 4A to FIG. 5I, the second electrode of the fourth transistor M4 may be connected to the first electrode of the driving transistor M0. In this way, when the fourth transistor M4 is switched on, a reference voltage signal may be provided to the first electrode of the driving transistor M0 to initialize the first electrode of the driving transistor M0.

In a specific implementation, in a pixel circuit according to an embodiment of the present disclosure, as shown in FIG. 4A to FIG. 5I, the fourth transistor M4 may be in a double-gate structure. Such double-gate structure may include a first sub-transistor M41 and a second sub-transistor M42 in series; where the control electrode of the first sub-transistor M41 and the control electrode of the second sub-transistor M42 may both be connected to the first scan signal terminal Scan1; the first electrode of the first transistor M41 is connected to the reference signal terminal VREF and the second electrode of the first sub-transistor M41 is connected to the first electrode of the second sub-transistor M42; the second electrode of the second transistor M42 is connected to the first node N1. In this way, the drain current at which the fourth transistor M4 is switched off can be reduced, which facilitates reducing an interference of the drain current from the fourth transistor M4 to the driving transistor M0 when the light emitting element L emits the light, and thus avoids an influence on the operating current of the driving transistor M0 which is used to drive the light emitting element to emit the light. Moreover, when the fourth transistor is further connected to the first electrode of the driving transistor, the connection node between the first sub-transistor and the second sub-transistor is further connected to the first electrode of the driving transistor M0, that is, the second electrode of the first sub-transistor M41 is connected to the first electrode of the driving transistor M0. Of course, the fourth transistor may also be with a single gate.

In a specific implementation, in a pixel circuit according to an embodiment of the present disclosure, as shown in FIG. 4A to FIG. 5I, the compensation control module 3 may include a fifth transistor M5 and a storage capacitor Cst.

The fifth transistor M5 has a control electrode connected to the second scan signal terminal Scan2, a first electrode connected to the control electrode of the driving transistor M0, and a second electrode connected to the second electrode of the driving transistor M0.

The storage capacitor Cst has a first terminal connected to the first power supply terminal PVDD and a second terminal connected to the control electrode of the driving transistor M0.

In a specific implementation, in a pixel circuit according to an embodiment of the present disclosure, as shown in FIG. 4A to FIG. 5I, the fifth transistor M5 may be a P-type transistor; alternatively, the fifth transistor may be a N-type transistor, and no limitation is made thereto.

In a specific implementation, in a pixel circuit according to an embodiment of the present disclosure, when the fifth transistor is switched on under control of a signal of the second scan signal terminal, the control electrode of the driving transistor is allowed to be connected with the second electrode of the driving transistor, so that the driving transistor forms a diode structure. A common voltage signal can be provided to the first electrode of the driving transistor via the first transistor, and can be provided to the control electrode of the driving transistor via the driving transistor of the diode structure, so that the common voltage signal and a threshold voltage of the driving transistor are written to the control electrode of the driving transistor. As a result, the driving transistor is allowed to have a large current flowing therethrough, so as to correct the threshold voltage shift of the driving transistor due to the bias stress, alleviate the hysteresis effect of the driving transistor and thus avoid the occurrence of the ghosting image. A data signal can be provided to the first electrode of the driving transistor via the second transistor and the third transistor, and can be provided to the control electrode of the driving transistor via the driving transistor of the diode structure, so that the data signal is written to the control electrode of the driving transistor. Because the threshold voltage of the driving transistor has already been captured before the data signal is written to the control electrode of the driving transistor, each time the data signal is written, the writing time of the data signal can be reduced; and when the light emitting element is driven to emit a light, the storage capacitor is used to maintain the voltage of the control electrode of the driving transistor.

In a specific implementation, in a pixel circuit according to an embodiment of the present disclosure, the time length for which the fifth transistor is switched on under control of a signal of the second scan signal terminal may be the time length for which one row of pixels are scanned. In a practical application, a data line for inputting a data signal has a resistance and a coupling capacitance with other signal lines, and thus results in large load for the data signal. As a result, the data signal input to the control electrode of the driving transistor within a relatively short time may be not complete. But in an embodiment of the present disclosure, when the fifth transistor starts to be switched on under control of the signal of the second scan signal terminal, a data signal has already been input to the data line. Because the first transistor is switched on before the second transistor is, the time for which the first transistor is switched on may allow the data line to be pre-charged by the data signal, and thus allow the data signal to reach the stable state, so that when the second transistor is switched on, the stable data signal is written to the control electrode of the driving transistor, thus improving the accuracy of the data signal writing and threshold voltage capture.

In a specific implementation, in a pixel circuit according to an embodiment of the present disclosure, as shown in FIG. 4A to FIG. 5I, the fifth transistor M5 may be in double-gate structure. Such double-gate structure may include a third sub-transistor M51 and a fourth sub-transistor M52 in series. The control electrode of the third sub-transistor M51 and the control electrode of the fourth sub-transistor M52 may both be connected to the second scan signal terminal Scan2; the first electrode of the third transistor M51 is connected to the first node N1 and the second electrode of the third sub-transistor M51 is connected to the first electrode of the fourth sub-transistor M52; and the second electrode of the fourth sub-transistor M52 is connected to the third node N3. In this way, the drain current at which the fifth transistor is switched off can be reduced, which facilitates reducing an interference of the drain current from the fifth transistor to the driving transistor when the light emitting element L emits the light, and avoids an influence on the driving current of the driving transistor. Of course, the fifth transistor may also be with a single gate.

In a specific implementation, in a pixel circuit according to an embodiment of the present disclosure, as shown in FIG. 4A to FIG. 5I, the light emitting module 4 may include a sixth transistor M6 and a seventh transistor M7.

The sixth transistor M6 has a control electrode connected to the light emitting control signal terminal EMIT, a first electrode connected to the first power supply terminal PVDD, and a second electrode connected to the first electrode of the driving transistor M0.

The seventh transistor M7 has a control electrode connected to the light emitting control signal terminal EMIT, a first electrode connected to the second electrode of the driving transistor M0, and a second electrode connected to the first terminal of the light emitting element L.

In a specific implementation, in a pixel circuit according to an embodiment of the present disclosure, as shown in FIG. 4A to FIG. 5I, the sixth transistor M6 and the seventh transistor M7 may be P-type transistors; alternatively, the sixth transistor and the seventh transistor may also be N-type transistors, and no limitation is made thereto.

In a specific implementation, in a pixel circuit according to an embodiment of the present disclosure, when the sixth transistor is switched on under control of a signal of the light emitting control signal terminal, a signal of the first power supply terminal may be provided to the first electrode of the driving transistor. When the seventh transistor is switched on under control of a signal of the light emitting control signal terminal, the second electrode of the driving transistor may be connected with the first terminal of the light emitting element, so that there can be a conductive path between the first power supply terminal and the second power supply terminal, and thus an operating current of the driving transistor can be generated to drive the light emitting element to emit the light.

In a specific implementation, in a pixel circuit according to an embodiment of the present disclosure, as shown in FIG. 5A to FIG. 5I, the anode resetting module 5 may include an eighth transistor M8. The eighth transistor M8 has a control electrode connected to the third scan signal terminal Scan3, a first electrode connected to the reference signal terminal VREF, and a second electrode connected to the first terminal of the light emitting element L.

In a specific implementation, in a pixel circuit according to an embodiment of the present disclosure, as shown in FIG. 5A to FIG. 5H, the eighth transistor M8 may be a P-type transistor. Alternatively, the eighth transistor may be a N-type transistor, and no limitation is made thereto.

In a specific implementation, in a pixel circuit according to an embodiment of the present disclosure, when the eighth transistor is switched on under control of a signal of the third scan signal terminal, a reference voltage signal may be provided to the first terminal of the light emitting element to reset the light emitting element.

In a specific implementation, in a pixel circuit according to an embodiment of the present disclosure, the third scan signal terminal may be the same signal terminal as the first scan signal terminal. As shown in FIG. 5F, the control electrode of the eighth transistor M8 is connected to the first scan signal terminal Scan1.

In a specific implementation, in a pixel circuit according to an embodiment of the present disclosure, the third scan signal terminal may also be the same signal terminal as the second scan signal terminal. As shown in FIG. 5G, the control electrode of the eighth transistor M8 is connected to the second scan signal terminal Scan2.

In a specific implementation, in a pixel circuit according to an embodiment of the present disclosure, the third scan signal terminal may be the same signal terminal as the first control signal terminal. As shown in FIG. 5H, the control electrode of the eighth transistor M8 is connected to the first control signal terminal CS1.

In a specific implementation, in a pixel circuit according to an embodiment of the present disclosure, the third scan signal terminal may also be the same signal terminal as the second control signal terminal; that is, the control electrode of the eighth transistor may be connected to the second control signal terminal.

In a specific implementation, in a pixel circuit according to an embodiment of the present disclosure, the third scan signal terminal may also be the same signal terminal as the light emitting control signal terminal. As shown in FIG. 5I, the control electrode of the eighth transistor M8 is connected to the light emitting control signal terminal EMIT; where the eighth transistor M8 is a N-type transistor, and both of the sixth transistor M6 and the seventh transistor M7 are P-type transistors. Of course, the eighth transistor M8 may be a P-type transistor; and both of the sixth transistor M6 and the seventh transistor M7 are N-type transistors, and no limitation is made thereto.

Further, to simplify the setting of signal lines, save the number of the signal ports, save wiring space, in a specific implementation, in a pixel circuit according to an embodiment of the present disclosure, the third scan signal terminal and the first control signal terminal are the same signal terminal, and the second control signal terminal and the first control signal terminal are the same signal terminal. As shown in FIG. 5H, the control electrodes of the first transistor M1, the second transistor M2 and the eighth transistor M8 are all connected to the first control signal terminal CS1.

The foregoing describes, by way of example, specific structures of various modules in the pixel circuit according to the embodiments of the present disclosure. In a specific implementation, the specific structures of various modules described above are not limited to those structures described above in the embodiments of the present disclosure; and other structures known to those skilled in the art are possible, and no limitation is made thereto.

In a pixel circuit according to an embodiment of the present disclosure, considering from the perspective of reducing drain current, any of the transistors may be set to have the double-gate structure, and no limitation is made thereto.

In order to allow the production process to be unified, in a pixel circuit according to an embodiment of the present disclosure, when the first control signal terminal CS1 and the second control signal terminal CS2 are not the same signal terminal, as shown in FIG. 4A and FIG. 5A, all of these transistors may be P-type transistors; alternatively, all of these transistors may be N-type transistors, and no limitation is made thereto.

In a pixel circuit according to an embodiment of the present disclosure, the P-type transistors are switched on by a low-level signal, and switched off by a high-level signal; and the N-type transistors are switched on by a high-level signal, and switched off by a low-level signal.

In a pixel circuit according to an embodiment of the present disclosure, each of the above described transistors may be a thin film transistor (TFT), or may be metal oxide semiconductor (MOS), and no limitation is made thereto. Furthermore, the control electrode of each of the above described transistors is a gate, the first electrode of each of the transistors may be a source, and correspondingly the second electrode is a drain; alternatively, the first electrode of each of the transistors may be a drain, and correspondingly the second electrode is a source, and no specific identification is made thereto.

An operating process for the pixel circuit according to the embodiments of the present disclosure will be described below in detail with reference to a timing diagram of the circuit. In the following description, 1 represents a high potential, and 0 represents a low potential. It shall be noted that 1 and 0 represent logic levels, and are only intended to better set forth a particular operating process according to an embodiment of the invention, but not to be limited to any particular voltage values. Moreover, the following is exemplified by the case where the time length for which the fifth transistor M5 is switched on under control of the signal of the second scan signal terminal Scan2 may be the time length for which one row of pixels are scanned.

FIRST EXAMPLE

Figure 6A:
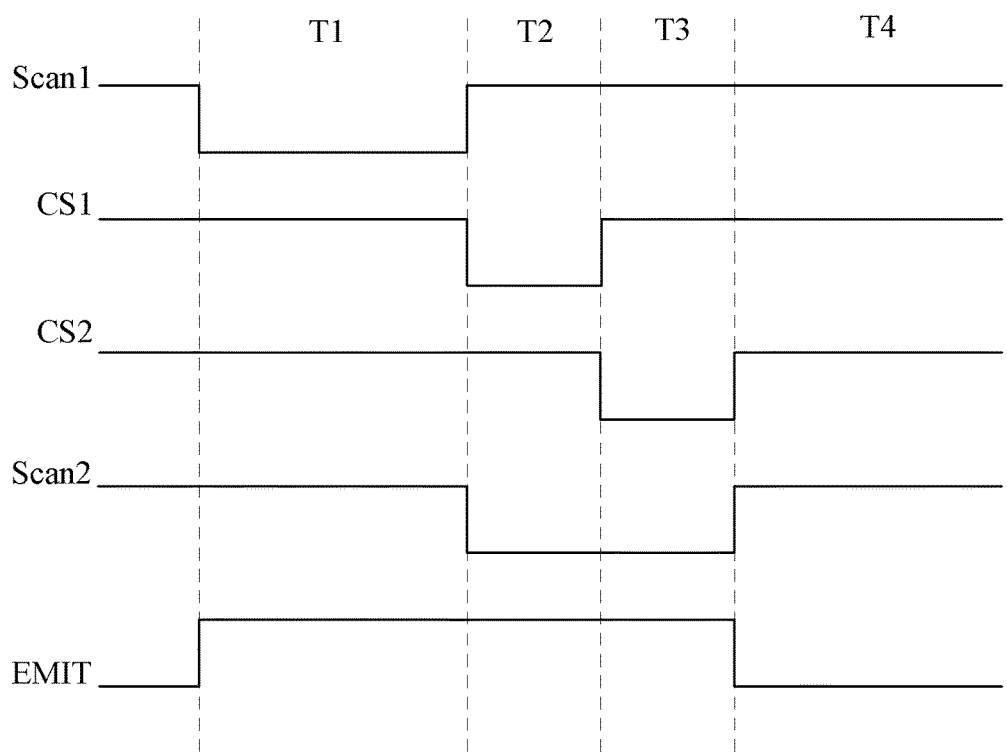
FIG. 6A shows an input timing diagram corresponding to the pixel circuit shown in FIG. 4A.

Taking the pixel circuit shown FIG. 4A as an example, the corresponding input timing diagram is shown in FIG. 6A. There are four stages T1, T2, T3 and T4 in the input timing diagram are shown in FIG. 6A as example.

In the T1 stage, Scan1=0, CS1=1, CS2=1, Scan2=1 and EMIT=1.

With Scan1=0, the fourth transistor M4 is switched on and a reference voltage signal is provided to the first node N1 and the second node N2, so that the voltages of the first node N1 and the second node N2 are the voltage $V_{ref}$ of the reference voltage signal, to initialize the control electrode M0 and the first electrode of the driving transistor M0. With CS1=1, the first transistor M1 is switched off. With CS2=1, the second transistor M2 is switched off. With Scan2=1, the fifth transistor M5 is switched off. With EMIT=1, the sixth transistor M6 and the seventh transistor M7 are switched off, and thus the light emitting element L does not emit the light.

In the T2 stage, Scan1=1, CS1=0, CS2=1, Scan2=0 and EMIT=1.

With Scan2=0, the fifth transistor M5 is switched on and the first node N1 connects with the third node N3, so that the driving transistor M0 is in a diode structure. With CS1=0, the first transistor M1 is switched on and a common voltage signal is provided to the second node N2, so that the voltage of the second node N2 is the voltage $V_{com}$ of the common voltage signal, and the first node N1 is charged with the voltage $V_{com}$ of the second node N2 via the diode structure of the driving transistor M0, until the voltage of the first node N1 becomes $V_{com}-|V_{th}|$. In this way, the threshold voltage $V_{th}$ of the driving transistor M0 can be captured at the first node N1, and the driving transistor M0 is allowed to have a large current flowing therethrough, so as to correct the shift of the threshold voltage $V_{th}$ of the driving transistor M0 due to the bias stress, alleviate the hysteresis effect of the driving transistor $V_{th}$ and thus avoid the occurrence of the ghosting image. With CS2=1, the second transistor M2 is switched off. With Scan1=1, the fourth transistor M4 is switched off. With EMIT=1, the sixth transistor M6 and seventh transistor M7 are switched off, and thus the light emitting element L does not emit light.

In the T3 stage, Scan1=1, CS1=1, CS2=0, Scan2=0 and EMIT=1.

With Scan2=0, the fifth transistor M5 keeps being switched on and the first node N1 is connects with the third node N3, so that the driving transistor M0 is in a diode structure. With CS2=0, the second transistor M2 is switched on and a data signal is provided to the second node N2, so that the voltage of the second node N2 is the voltage $V_{data}$ of the data signal. The first node N1 is charged with the voltage $V_{data}$ of the second node N2 via the diode structure of the driving transistor M0, until the voltage of the first node N1 becomes $V_{data}-|V_{td}|$. In this way, when the data signal is input, the voltage of the second node N2 may jump to $V_{data}$ from $V_{com}$, and the voltage of the first node N1 may jump to $V_{data}-|V_{th}|$ from $V_{com}-|V_{th}|$. Therefore, whether transition from high gray scale to middle gray scale or transition from low gray scale to middle gray scale, the captured voltages of the threshold voltage $V_{th}$ can be same, and the time for which the first node N1 is charged with the data signal may also be saved, thus facilitating a data signal to be written into a high resolution display panel. Moreover, $V_{data} \geq V_{com}$ is set to facilitate writing the data signal to the first node N1. With CS1=1, the first transistor M1 is switched off. With Scan1=1, the fourth transistor M4 is switched off. With EMIT=1, the sixth transistor M6 and the seventh transistor M7 are switched off, and thus the light emitting element L does not emit light.

In the T4 stage, Scan1=1, CS1=1, CS2=1, Scan2=1 and EMIT=0.

With EMIT=0, the sixth transistor M6 and the seventh transistor M7 are switched on, and a signal from the first power supply terminal PVDD can be input to the second node N2, so that the voltage of the second node N2 is the voltage $V_{dd}$ of the signal from the first power supply terminal PVDD. At this time, the source-to-gate voltage of the driving transistor M0 is $V_{sg}=V_{dd}-V_{data}+|V_{th}|$, and an operating current $I_L$ generated by the driving transistor M0 for driving the light emitting element L to emit the light satisfies the following equation: $I_L=K(V_{sg}-|V_{th}|)^2=K(V_{dd}-V_{data})^2$; the seventh transistor M7 is switched on, so that the light emitting element L is driven by the operating current $I_L$ from the driving transistor M0 to emit the light. With CS1=1, the first transistor M1 is switched off. With CS2=1, the second transistor M2 is switched off. With Scan1=1, the fourth transistor M4 is switched off. With Scan2=1, the fifth transistor M5 is switched off.

Figure 4B:
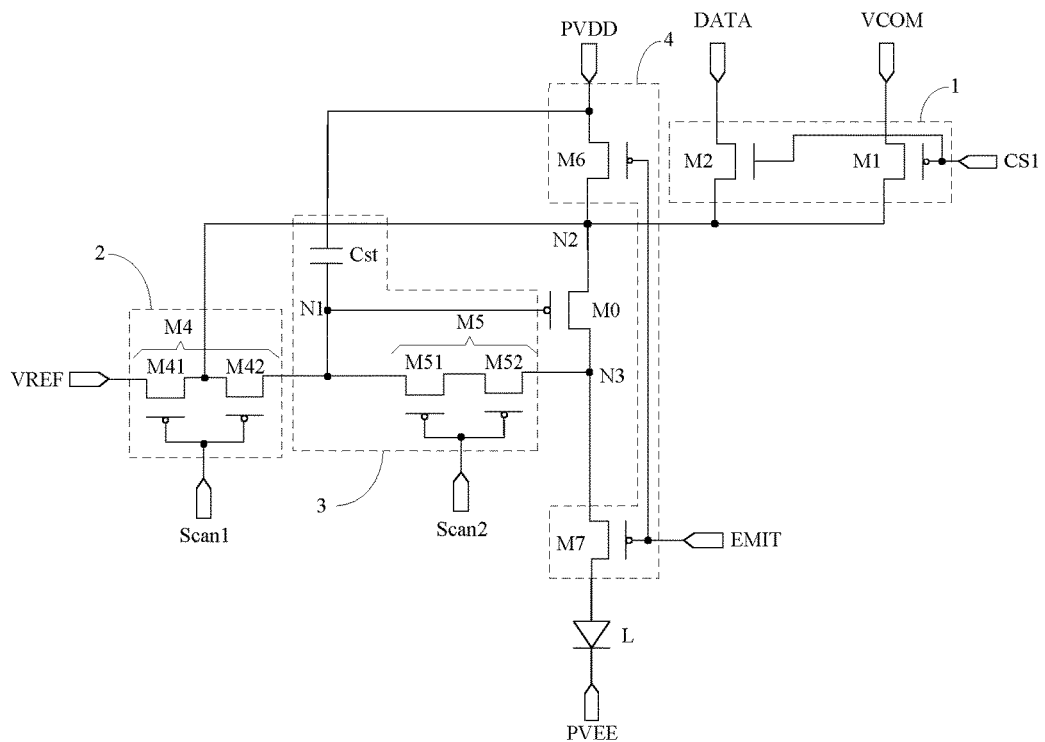
FIG. 4B shows another detailed structural diagram of the pixel circuit shown in FIG. 3A.
Figure 4C:
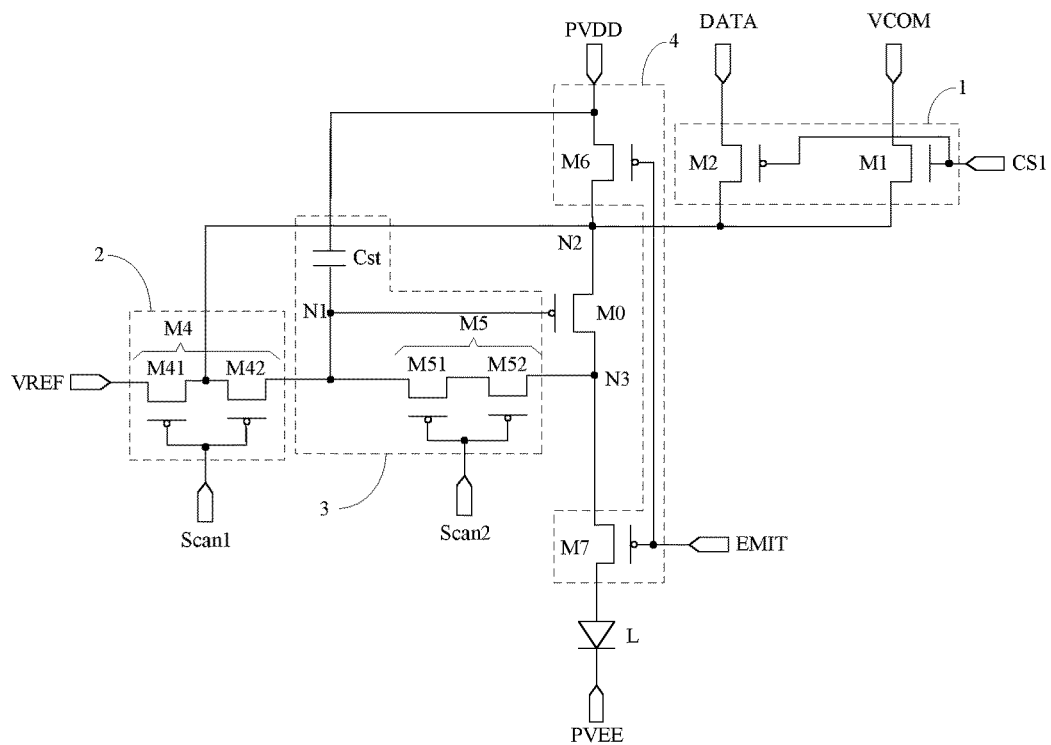
FIG. 4C shows further another detailed structural diagram of the pixel circuit shown in FIG. 3A.

If the first control signal terminal CS1 and the second control signal terminal CS2 are the same signal terminal, as shown in FIG. 4B, the first transistor M1 is a P-type transistor, and the second transistor M2 is a N-type transistor, and the control electrode of the second transistor M2 is controlled by the same signal of the first control signal terminal CS1 in first example; the structures of the other transistors are the same as those in the pixel circuit shown in FIG. 4A; and the operating process for the pixel circuit shown in FIG. 4B may follow the operating process for the pixel circuit according to the first example, and no repeated description thereof is given. Alternatively, as shown in FIG. 4C, the first transistor M1 is a N-type transistor, and the second transistor M2 is a P-type transistor, where the signal input to the control electrode of the second transistor M2 is reverse in phase to the signal of the first control signal terminal CS1 in the first example; the structures of the other transistors are the same as those in the pixel circuit shown in FIG. 4A; and the operating process for the pixel circuit shown in FIG. 4C may follow the operating process for the pixel circuit according to the first example, and no repeated description thereof is given.

SECOND EXAMPLE

Figure 4D:
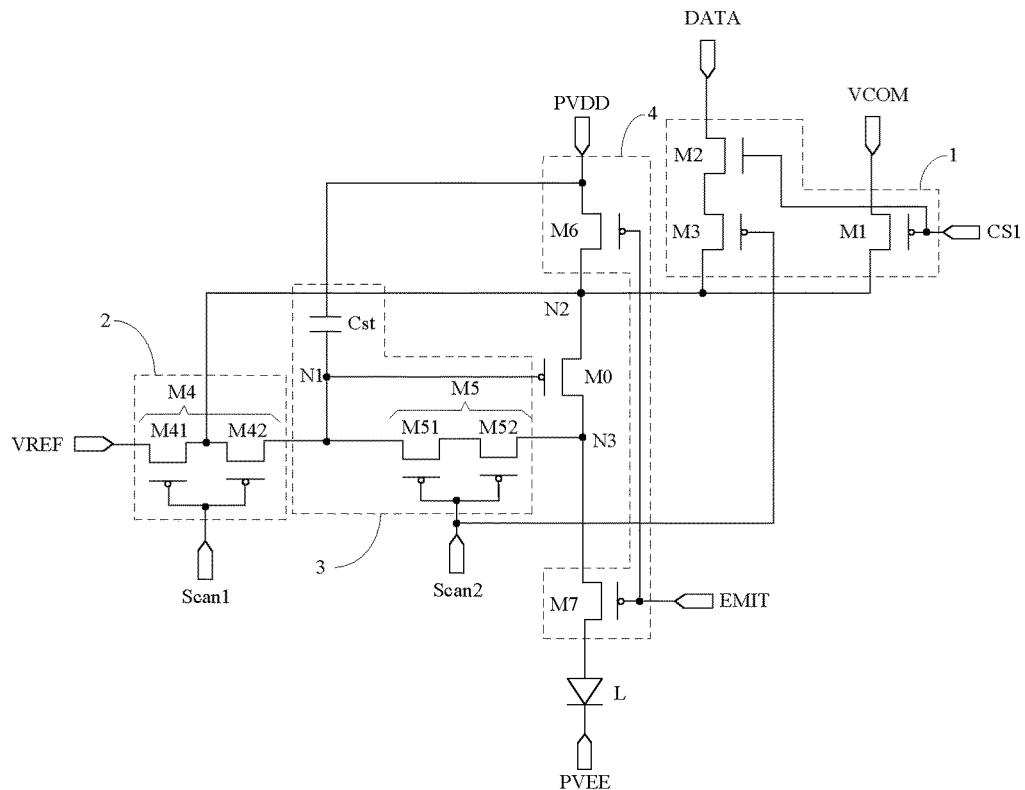
FIG. 4D shows further another detailed structural diagram of the pixel circuit shown in FIG. 3A.
Figure 6B:
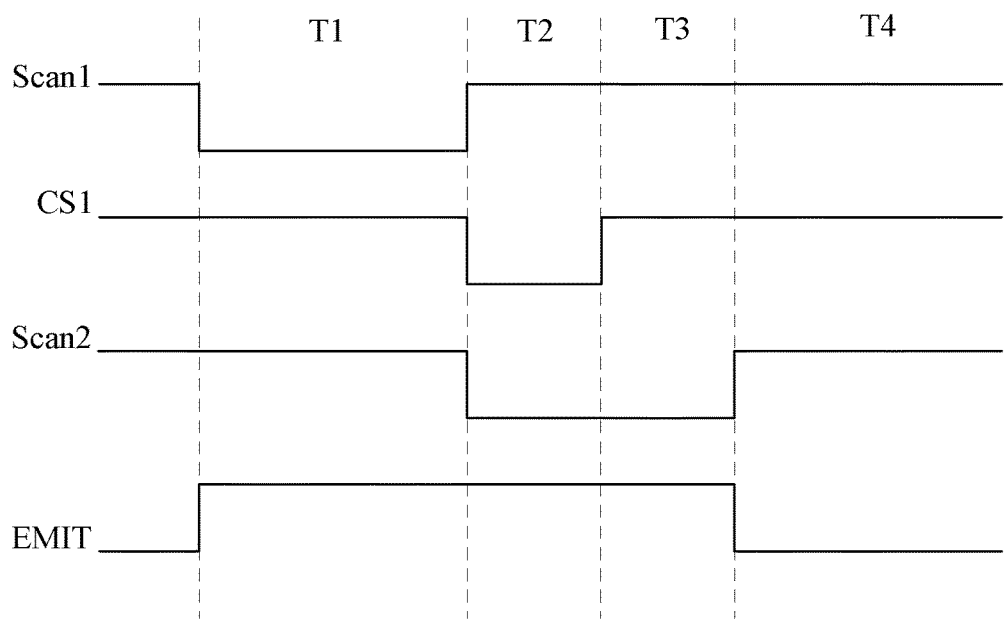
FIG. 6B shows an input timing diagram corresponding to the pixel circuit shown in FIG. 4D.

Taking the pixel circuit shown FIG. 4D as an example, the corresponding input timing diagram is shown in FIG. 6B. Specifically, there are four stages T1, T2, T3 and T4 in the input timing diagram shown in FIG. 6B as example.

In the T1 stage, Scan1=0, CS1=1, Scan2=1 and EMIT=1.

With Scan1=0, the fourth transistor M4 is switched on and a reference voltage signal is provided to the first node N1 and the second node N2, so that the voltages of the first node N1 and the second node N2 are the voltage $V_{ref}$ of the reference voltage signal, to initialize the control electrode M0 and the first electrode of the driving transistor M0. With CS1=1, the first transistor M1 is switched off and the second transistor M2 is switched off. With Scan2=1, the third transistor M3 and the fifth transistor M5 are switched off. With EMIT=1, the sixth transistor M6 and the seventh transistor M7 are switched off, and thus the light emitting element L does not emit light.

In the T2 stage, Scan1=1, CS1=0, Scan2=0 and EMIT=1.

With Scan2=0, the fifth transistor M5 and the third transistor M3 are switched on, the first node N1 connects with the third node N3 through the fifth transistor M5, so that the driving transistor M0 is in a diode structure. With CS1=0, the second transistor M2 is switched off, and the first transistor M1 is switched on and a common voltage signal is provided to the second node N2, so that the voltage of the second node N2 is the voltage $V_{com}$ of the reference voltage signal. The first node N1 is charged with the voltage $V_{com}$ of the second node N2 via the diode structure of the driving transistor M0, until the voltage of the first node N1 becomes $V_{com}-|V_{th}|$. In this way, the threshold voltage $V_{th}$ of the driving transistor M0 can be captured at the first node N1, and thus the driving transistor M0 is allowed to have a large current flowing therethrough, so as to correct the shift of the threshold voltage $V_{th}$ of the driving transistor M0 due to the bias stress, alleviate the hysteresis effect of the driving transistor $V_{th}$ and thus avoid the occurrence of the ghosting image. Moreover, at this time, a data line is input on the data line to charge the data line so that the data signal reaches a stable state. With Scan1=1, the fourth transistor M4 is switched off. With EMIT=1, the sixth transistor M6 and the seventh transistor M7 are switched off, and thus the light emitting element L does not emit light.

In the T3 stage, Scan1=1, CS1=1, Scan2=0 and EMIT=1.

With Scan2=0, the fifth transistor M5 and the third transistor M3 keep being switched on, the first node N1 connects with the third node N3 through the fifth transistor M5, so that the driving transistor M0 is in a diode structure. Since the third transistor M3 is switched on and CS1=1, the second transistor M2 is switched on and a stable data signal can be provided to the second node N2, so that the voltage of the second node N2 is the voltage $V_{data}$ of the data signal. The first node N1 is charged with the voltage $V_{data}$ of the second node N2 via the diode structure of the driving transistor M0, until the voltage of the first node N1 becomes $V_{data}-|V_{th}|$. In this way, when the data signal is input, the voltage of the second node N2 may jump to $V_{data}$ from $V_{com}$, and the voltage of the first node N1 may jump to $V_{data}-|V_{th}|$ from $V_{com}-|V_{th}|$. Therefore, whether transition from high gray scale to middle gray scale or transition from low gray scale to middle gray scale, the captured voltages of the threshold voltage $V_{th}$ can be same, and the time for which the first node N1 is charged with the data signal may also be saved, thus facilitating a data signal to be written into a high resolution display panel. Moreover, $V_{data} \geq V_{com}$ is set to facilitate writing the data signal to the first node N1. With CS1=1, the first transistor M1 is switched off. With Scan1=1, the fourth transistor M4 is switched off. With EMIT=1, the sixth transistor M6 and the seventh transistor M7 are switched off, and thus the light emitting element L does not emit light.

In the T4 stage, Scan1=1, CS1=1, Scan2=1 and EMIT=0.

With EMIT=0, the sixth transistor M6 and the seventh transistor M7 are switched on, a signal from the first power supply terminal PVDD is input to the second node N2 through the sixth transistor M6, so that the voltage of the second node N2 is the voltage $V_{dd}$ of the signal from the first power supply terminal PVDD. At this time, the source-to-gate voltage of the driving transistor M0 is $V_{sg}=V_{dd}-V_{data}+|V_{th}|$, and an operating current $I_L$ generated by the driving transistor M0 for driving the light emitting element L to emit the light satisfies the following equation: $I_L=K(V_{sg}-|V_{th}|)^2=K(V_{dd}-V_{data})^2$; the seventh transistor M7 is switched on, so that the light emitting element L is driven by the operating current $I_L$ from the driving transistor M0 to emit the light. With CS1=1, the first transistor M1 is switched off and the second transistor M2 is switched on. With Scan1=1, the fourth transistor M4 is switched off. With Scan2=1, the third transistor M3 and the fifth transistor M5 are switched off.

Figure 4E:
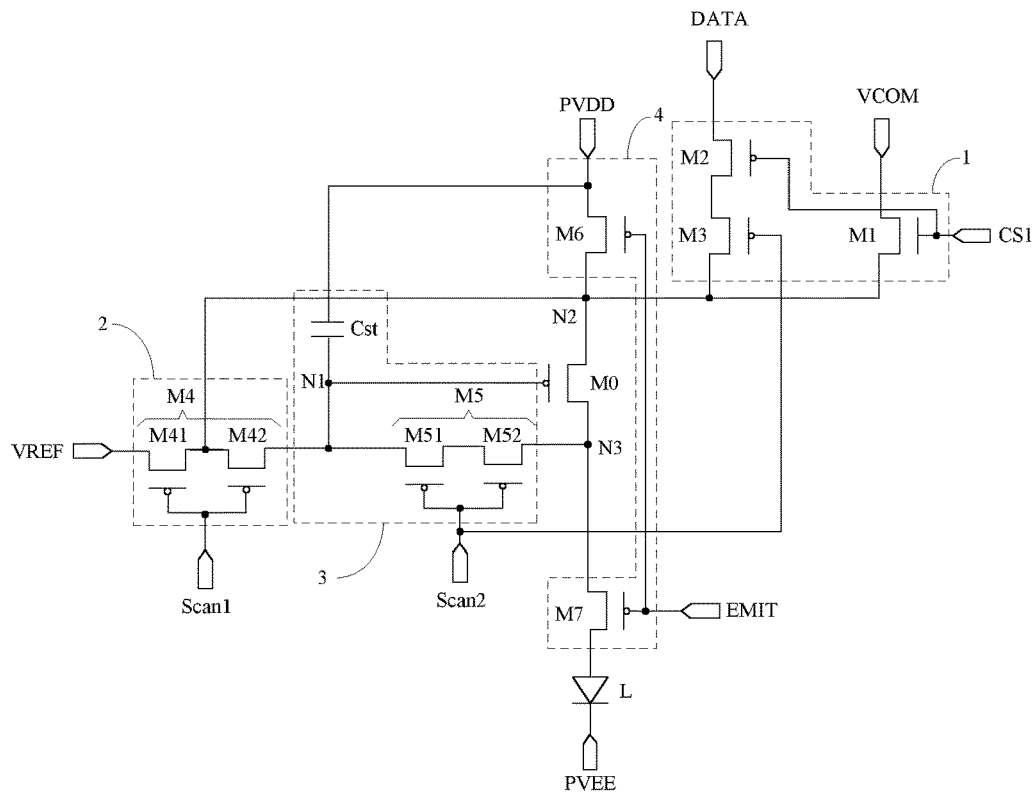
FIG. 4E shows further another detailed structural diagram of the pixel circuit shown in FIG. 3A.

In the pixel circuit as shown in FIG. 4E, the first transistor M1 is a N-type transistor, and the second transistor M2 is a P-type transistor, the signal input to the control electrode of the second transistor M2 is reverse in phase to the signal of the first control signal terminal CS1 in the second example; the structures of the other transistors is the same as those in the pixel circuit shown in FIG. 4D; and the operating process for the pixel circuit shown in FIG. 4E may follow the operating process for the pixel circuit according to the second example, and no repeated description thereof is given.

THIRD EXAMPLE

Figure 6C:
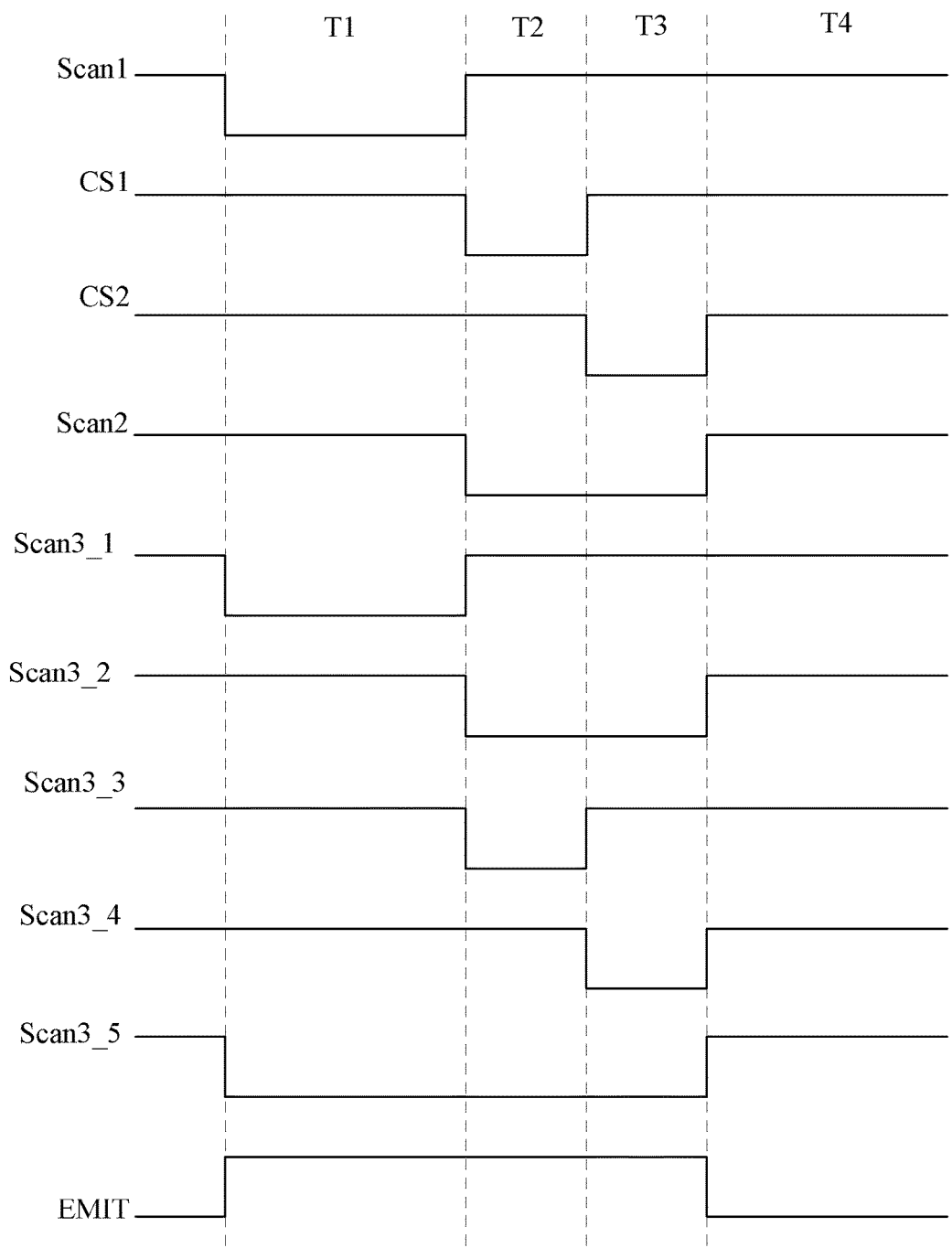
FIG. 6C shows an input timing diagram corresponding to the pixel circuit shown in FIG. 5A.

Taking the pixel circuit shown FIG. 5A as an example, the corresponding input timing diagram is shown in FIG. 6C. There are four stages T1, T2, T3 and T4 in the input timing diagram shown in FIG. 6C as an example. Moreover, Scan3_1 in FIG. 6C represents the signal of the third scan signal terminal Scan3 in the pixel circuit shown in FIG. 5A.

In the T1 stage, With Scan3_1=0, the eighth transistor M8 is switched on and a reference voltage signal is provided to the first terminal of the light emitting element L to reset the light emitting element L, so that the influence of light emission for the previous frame on the light emission for the current frame is avoided. In the T2-T4 stages, With Scan3_1=1, the eight transistor M8 is switched off. The operating processes for the remaining transistors may basically the same as the operating processes for respective transistors during T1-T4 stages in the first example, and no repeated description thereof is given.

It can be found from third example that the potential of the signal Scan3_1 of the third scan signal terminal Scan3 is the same as that of the signal of the first scan signal terminal Scan1, therefore, the operating process of the pixel circuit in which the third scan signal terminal and the first scan signal terminal are the same terminal may follow the operating process for the pixel circuit according to third example, and no repeated description thereof will be given below.

FOURTH EXAMPLE

Taking the pixel circuit shown FIG. 5A as an example, the corresponding input timing diagram is shown in FIG. 6C. There are four stages T1, T2, T3 and T4 in the input timing diagram shown in FIG. 6C as an example. Moreover, Scan3_2 in FIG. 6C represents the signal of the third scan signal terminal Scan3 in the pixel circuit shown in FIG. 5A.

In the T2 and T3 stages, With Scan3_2=0, the eighth transistor M8 is switched on and a reference voltage signal is provided to the first terminal of the light emitting element L to reset the light emitting element L, so that the influence of light emission for the previous frame on the light emission for current frame is avoided. In the T1 and T4 stages, With Scan3_2=1, the eight transistor M8 is switched off, the operating processes for the remaining transistors may basically the same as the operating processes for respective transistors during T1-T4 stages in the first example, and no repeated description thereof is given.

It can be found from fourth example that the potential of the signal Scan3_2 of the third scan signal terminal Scan3 is the same as that of the signal of the first scan signal terminal Scan2, therefore, the operating process of the pixel circuit in which the third scan signal terminal and the first scan signal terminal are the same terminal may follow the operating process for the pixel circuit according to the fourth example, and no repeated description thereof will be given below.

FIFTH EXAMPLE

Taking the pixel circuit shown FIG. 5A as an example, the corresponding input timing diagram is shown in FIG. 6C. There are four stages T1, T2, T3 and T4 in the input timing diagram shown in FIG. 6C as an example. Moreover, Scan3_3 in FIG. 6C represents the signal of the third scan signal terminal Scan3 in the pixel circuit shown in FIG. 5A.

In the T2 stage, With Scan3_3=0, the eighth transistor M8 is switched on and a reference voltage signal is provided to the first terminal of the light emitting element L, to reset the light emitting element L, so that the influence of light emission for the previous frame on the light emission for the current frame is avoided. In the T1, T3 and T4 stages, With Scan3_3=1, the eight transistor M8 is switched off, the operating processes for the remaining transistors may basically the same as the operating processes for respective transistors during T1-T4 stages in the first example, and no repeated description thereof is given.

It can be found from the fifth example that the potential of the signal Scan3_3 of the third scan signal terminal Scan3 is the same as that of the signal of the first control signal terminal CS1, therefore, the operating process of the pixel circuit in which the third scan signal terminal and the first control signal terminal are the same terminal may follow the operating process for the pixel circuit according to the fifth example, and no repeated description thereof will be given below.

SIXTH EXAMPLE

Taking the pixel circuit shown FIG. 5A as an example, the corresponding input timing diagram is shown in FIG. 6C. There are four stages T1, T2, T3 and T4 in the input timing diagram shown in FIG. 6C as an example. Moreover, Scan3_4 in FIG. 6C represents the signal of the third scan signal terminal Scan3 in the pixel circuit shown in FIG. 5A.

In the T3 stage, With Scan3_4=0, the eighth transistor M8 is switched on and a reference voltage signal is provided to the first terminal of the light emitting element L, to reset the light emitting element L, so that the influence of light emission for the previous frame on light emission for the current frame is avoided. In the T1, T2 and T4 stages, With Scan3_4=1, the eight transistor M8 is switched off, the operating processes for the remaining transistors may basically the same as the operating processes for respective transistors during T1-T4 stages in the first example, and no repeated description thereof is given.

It can be found from the sixth example that the potential of the signal Scan3_4 of the third scan signal terminal Scan3 is the same as that of the signal of the second control signal terminal CS2, therefore, the operating process of the pixel circuit in which the third scan signal terminal and the second control signal terminal are the same terminal may follow the operating process for the pixel circuit according to the sixth example, and no repeated description thereof will be given below.

SEVENTH EXAMPLE

Taking the pixel circuit shown FIG. 5A as an example, the corresponding input timing diagram is shown in FIG. 6C. There are four stages T1, T2, T3 and T4 in the input timing diagram shown in FIG. 6C as an example. Moreover, Scan3_5 in FIG. 6C represents the signal of the third scan signal terminal Scan3 in the pixel circuit shown in FIG. 5A.

In the T1-T3 stages, With Scan3_5=0, the eighth transistor M8 is switched on and a reference voltage signal is provided to the first terminal of the light emitting element L, to reset the light emitting element L, so that the influence of light emission for the previous frame on light emission for the current frame is avoided. In the T4 stage, With Scan3_5=1, the eight transistor M8 is switched off, the operating processes for the remaining transistors may basically the same as the operating processes for respective transistors during T1-T4 stages in the first example, and no repeated description thereof is given.

It can be found from the seventh example that the potential of the signal Scan3_5 of the third scan signal terminal Scan3 is opposite to the potential of the signal of the light emitting control terminal EMIT, therefore, the operating process of the pixel circuit in which the third scan signal terminal and the light emitting control signal terminal are the same terminal may follow the operating process for the pixel circuit according to the seventh example, and no repeated description thereof will be given below.

EIGHTH EXAMPLE

Figure 5D:
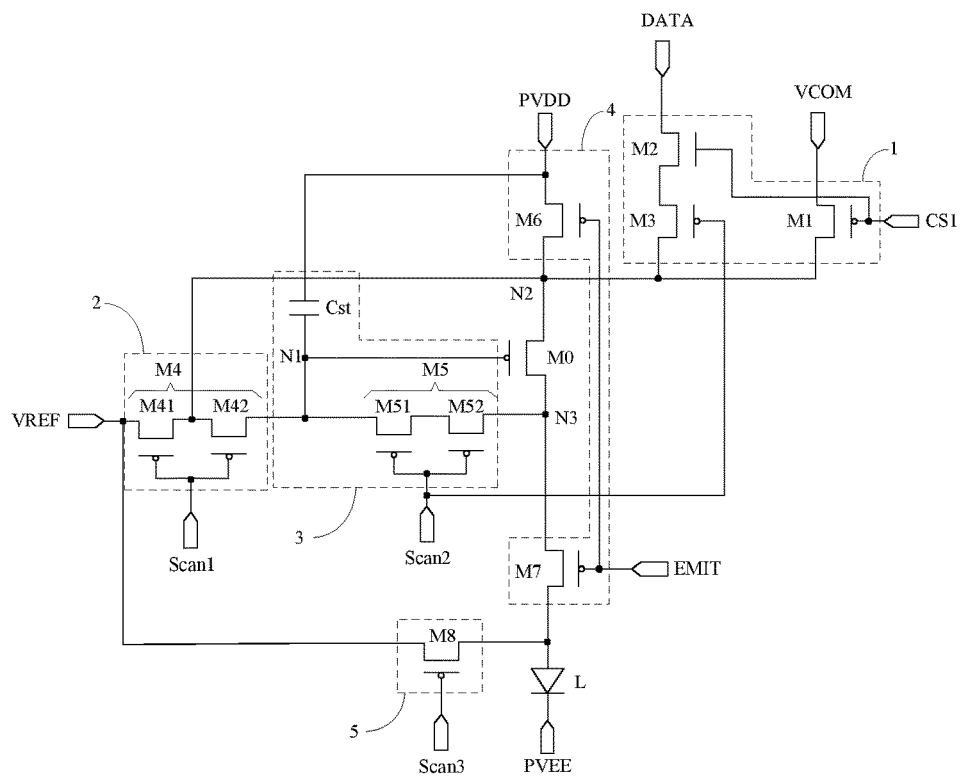
FIG. 5D shows further another detailed structural diagram of the pixel circuit shown in FIG. 3B.
Figure 5E:
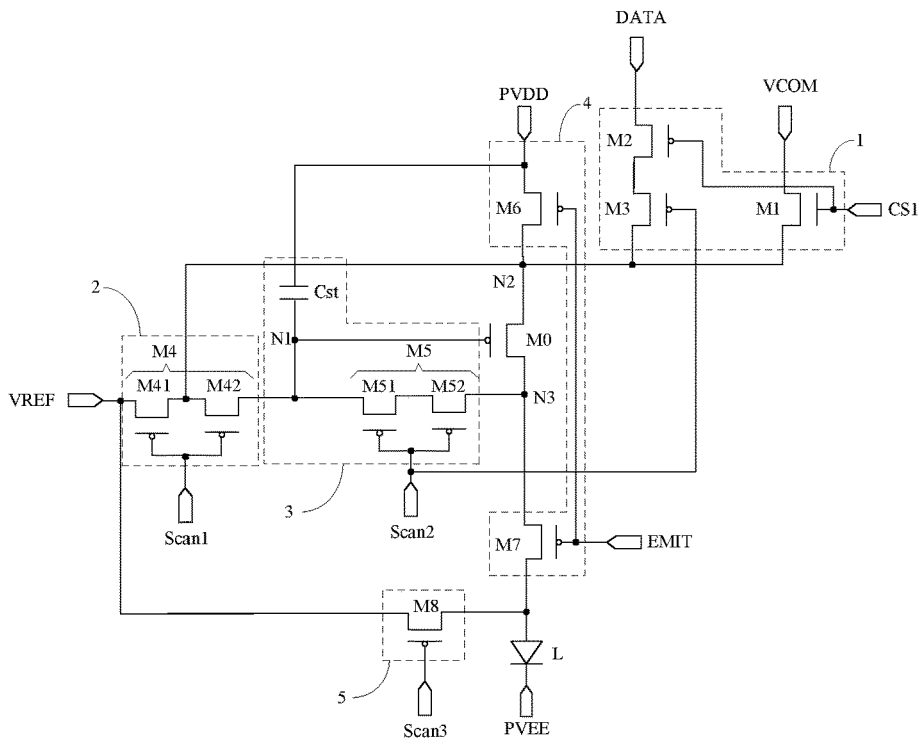
FIG. 5E shows further another detailed structural diagram of the pixel circuit shown in FIG. 3B.
Figure 5F:
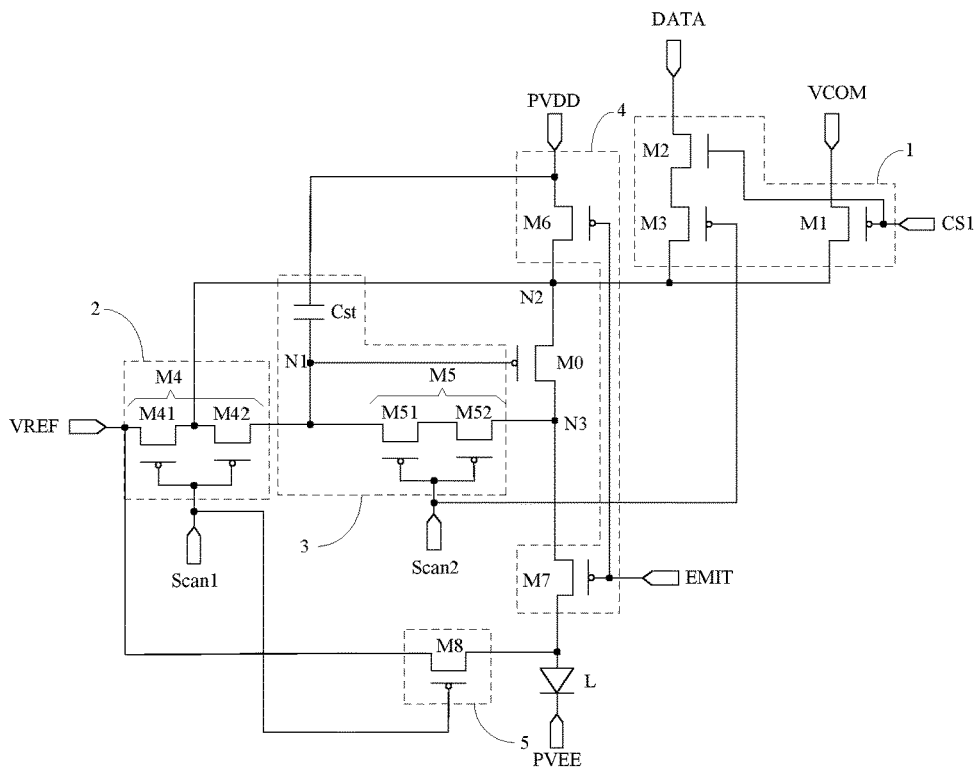
FIG. 5F shows further another detailed structural diagram of the pixel circuit shown in FIG. 3B.
Figure 5G:
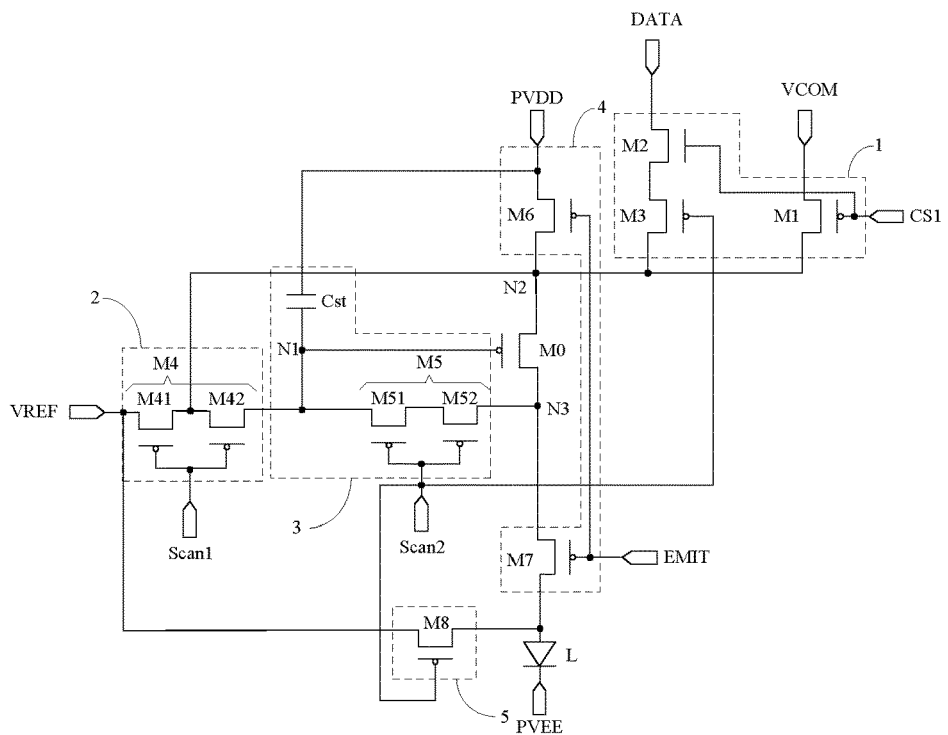
FIG. 5G shows further another detailed structural diagram of the pixel circuit shown in FIG. 3B.
Figure 5H:
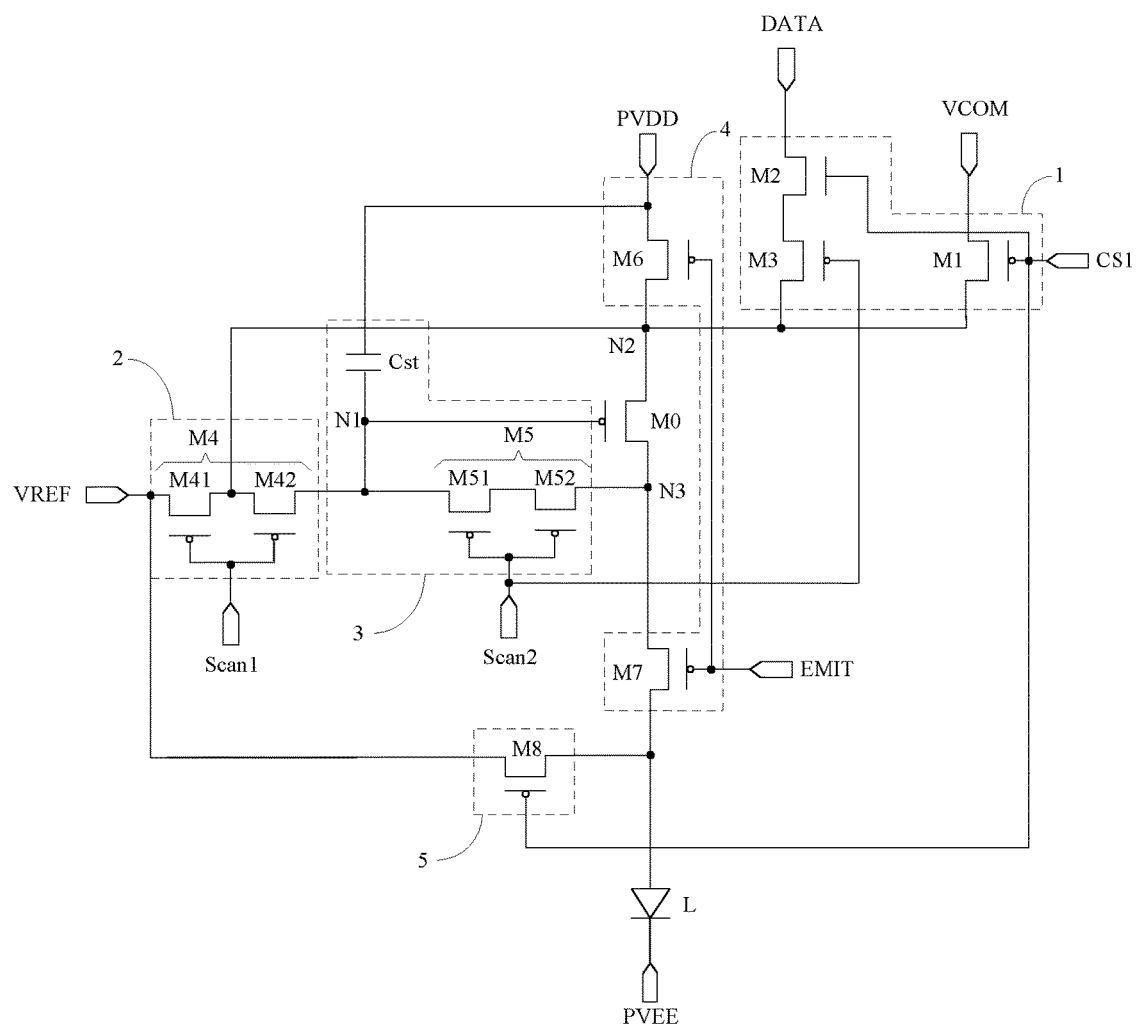
FIG. 5H shows further another detailed structural diagram of the pixel circuit shown in FIG. 3B.
Figure 5I:
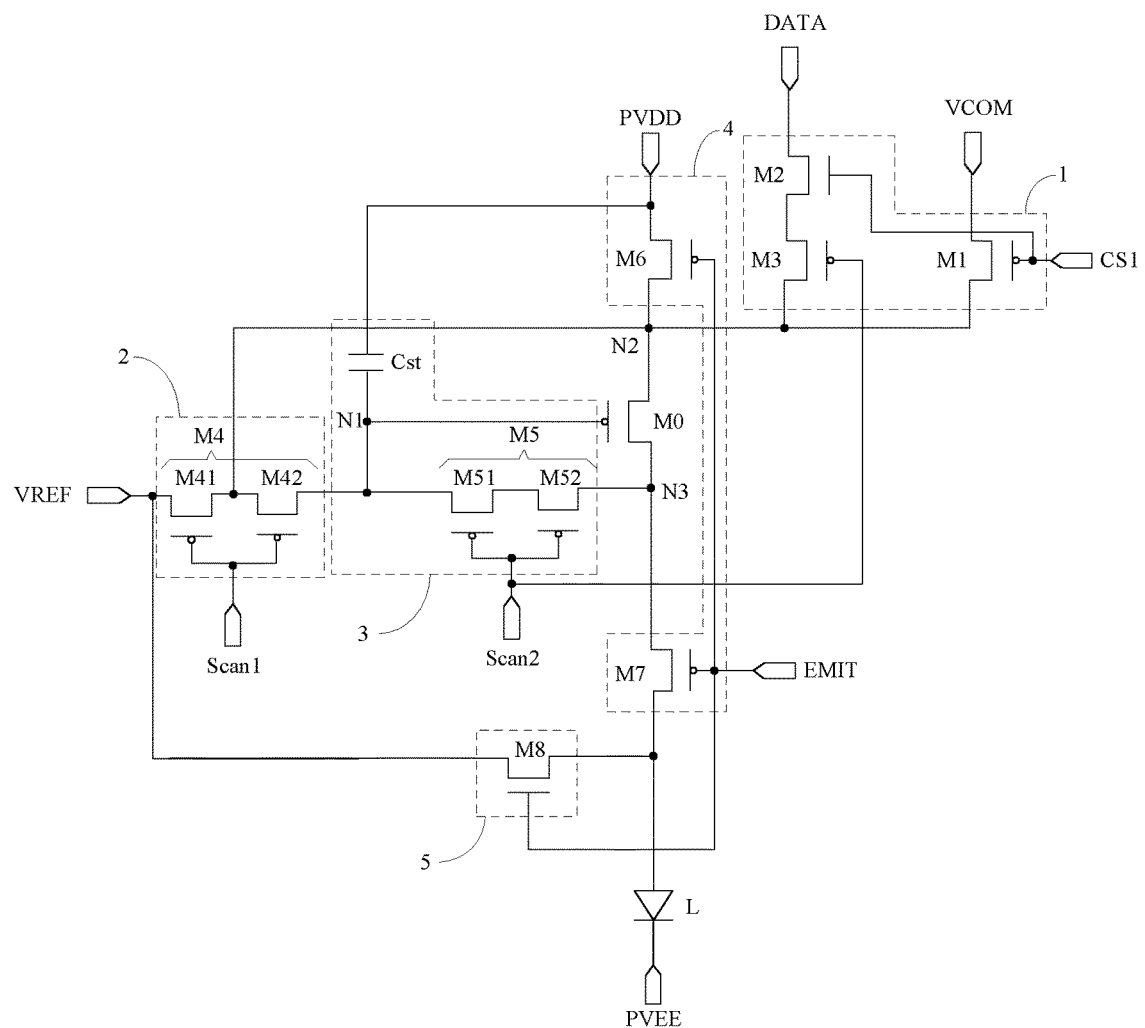
FIG. 5I shows further another detailed structural diagram of the pixel circuit shown in FIG. 3B.
Figure 6D:
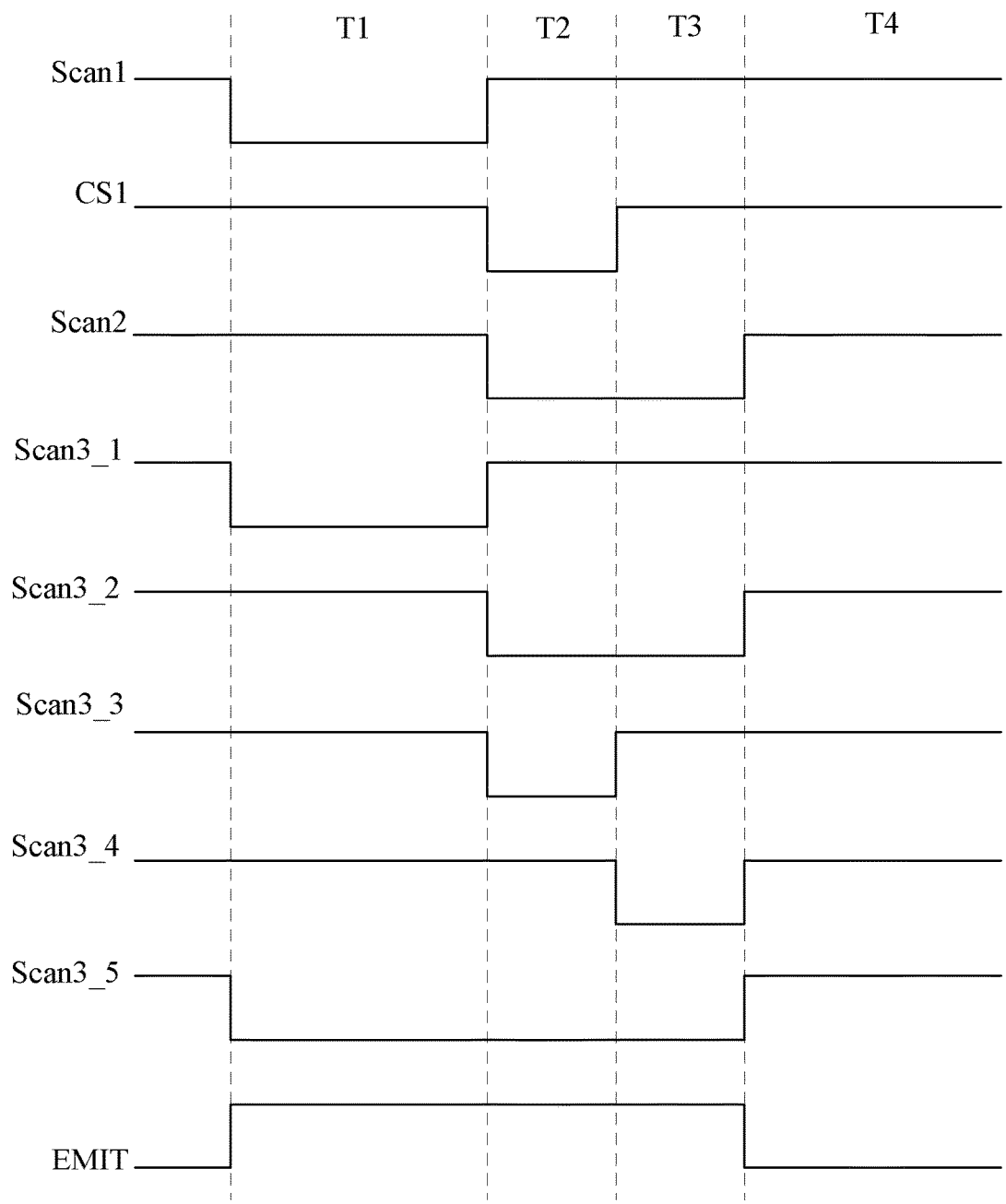
FIG. 6D shows an input timing diagram corresponding to the pixel circuit shown in FIG. 5D.

Taking the pixel circuit shown FIG. 5D as an example, the corresponding input timing diagram is shown in FIG. 6D. There are four stages T1, T2, T3 and T4 in the input timing diagram shown in FIG. 6D as an example. Moreover, Scan3_1 in FIG. 6D represents the signal of the third scan signal terminal Scan3 in the pixel circuit shown in FIG. 5D.

In the T1 stage, With Scan3_1=0, the eighth transistor M8 is switched on and a reference voltage signal is provided to the first terminal of the light emitting element L, to reset the light emitting element L, so that the influence of light emission for the previous frame on light emission for the current frame is avoided. In the T2-T4 stages, With Scan3_1=1, the eight transistor M8 is switched off, the operating processes for the remaining transistors may basically the same as the operating processes for respective transistors during T1-T4 stages in the second example, and no repeated description thereof is given.

It can be found from the eighth example that the potential of the signal Scan3_1 of the third scan signal terminal Scan3 is the same as that of the signal of the first scan signal terminal Scan1, therefore, the operating process of the pixel circuit shown in FIG. 5D and in a case that the third scan signal terminal and the first scan signal terminal are the same terminal (as shown in FIG. 5F) may follow the operating process of the pixel circuit according to the eighth example, and no repeated description thereof will be given below.

NINTH EXAMPLE

Taking the pixel circuit shown FIG. 5D as an example, the corresponding input timing diagram is shown in FIG. 6D. There are four stages T1, T2, T3 and T4 in the input timing diagram shown in FIG. 6D as an example. Moreover, Scan3_2 in FIG. 6D represents the signal of the third scan signal terminal Scan3 in the pixel circuit shown in FIG. 5D.

In the T2 and T3 stages, With Scan3_2=0, the eighth transistor M8 is switched on and a reference voltage signal is provided to the first terminal of the light emitting element L, to reset the light emitting element L, so that the influence of light emission for the previous frame on light emission for the current frame is avoided. In the T1 and T4 stages, With Scan3_2=1, the eight transistor M8 is switched off, the operating processes for the remaining transistors may basically the same as the operating processes for respective transistors during T1-T4 stages in the second example, and no repeated description thereof is given.

It can be found from the ninth example that the potential of the signal Scan3_2 of the third scan signal terminal Scan3 is the same as that of the signal of the first scan signal terminal Scan2, therefore, the operating process of the pixel circuit shown in FIG. 5D and in a case that the third scan signal terminal and the second scan signal terminal are the same terminal (as shown in FIG. 5G) may follow the operating process of the pixel circuit according to the ninth example, and no repeated description thereof will be given below.

TENTH EXAMPLE

Taking the pixel circuit shown FIG. 5D as an example, the corresponding input timing diagram is shown in FIG. 6D.

There are four stages T1, T2, T3 and T4 in the input timing diagram shown in FIG. 6D as an example. Moreover, Scan3_3 in FIG. 6D represents the signal of the third scan signal terminal Scan3 in the pixel circuit shown in FIG. 5D.

In the T2 stage, With Scan3_3=0, the eighth transistor M8 is switched on and a reference voltage signal is provided to the first terminal of the light emitting element L, to reset the light emitting element L, so that the influence of light emission for the previous frame on light emission for the current frame is avoided. In the T1, T3 and T4 stages, With Scan3_3=1, the eight transistor M8 is switched off, the operating processes for the remaining transistors may basically the same as the operating processes for respective transistors during T1-T4 stages in the second example, and no repeated description thereof is given.

Consider an analogue simulation of the pixel circuits shown in FIG. 4A-FIG. 5I, when the grayscale value of the (n−1)th frame is 0, the grayscale value of the n-th frame is 255 and grayscale value of the (n+1)th frame is 255, the potentials of a first node N1 and a second node N2 in different time stages are measured and the measured results are shown in the following table 2.

TABLE 2

| | Grayscale Value | | | | | |
|---|---|---|---|---|---|---|
| | 0 | 255 | | | 255 | |
| | | Frame number | | | | |
| | (n − 1)th frame | n-th frame | | | (n + 1)th frame | |
| Stage | T4 | T2 | T3 | T4 | T2 | T3 |
| N1 | 3.44 | −0.3 | 1.03 | 1.5 | −0.3 | 1.03 |
| N2 | 4.6 | 2 | 3.5 | 4.6 | 2 | 3.5 |

It can be seen from the above table 2 that, in the T3 stage, the voltage of the second node N2 in the n-th frame is the same as that of the second node N2 in the (n+1)th frame. Specifically, in the T2 stage, the potential of the second node N2 is reset to be 2 by the common voltage signal and the threshold voltage of the driving transistor is written to the first node N1 so that the voltage of the first node N1 is −0.3. In the T3 stage, when a data signal is written, the voltage of the first node N1 jumps to 1.03 from −0.3 because the voltage of the second node N2 jumps to 3.5 from 2. As can be seen, no matter how the potential of the second node N2 during the T1 stage changes, when a data signal is written for each frame, the voltage of the second node N2 can always jump from 2, and the voltage of the first node N1 can jump from −0.3, so that the potential of the first node N1 in the n-th frame and the potential of the first node N1 at the (n+1)th frame will not be influenced when the data signal is written, and thus the brightness consistency between the n-th frame and the (n+1)th frame is guaranteed. Moreover, in the T3 stage, when a data signal is written, the time for which the voltage of the second node N2 jumps to the voltage of the data signal is relative small since the voltage jump is from 2 to 3.5, and thereby the time for which the data signal is written to the first node N1 can also be reduced.

Moreover, it can be found from the tenth example that the potential of the signal Scan3_3 of the third scan signal terminal Scan3 is the same as that of the signal of the first control signal terminal CS1, therefore, the operating process of the pixel circuit shown in FIG. 5D and in a case that the third scan signal terminal and the first control signal terminal are the same terminal (as shown in FIG. 5H) may follow the operating process of the pixel circuit according to the tenth example, and no repeated description thereof is given.

ELEVENTH EXAMPLE

Taking the pixel circuit shown FIG. 5D as an example, the corresponding input timing diagram is shown in FIG. 6D. There are four stages T1, T2, T3 and T4 in the input timing diagram shown in FIG. 6D as an example. Moreover, Scan3_4 in FIG. 6D represents the signal of the third scan signal terminal Scan3 in the pixel circuit shown in FIG. 5D.

In the T3 stage, With Scan3_4=0, the eighth transistor M8 is switched on and a reference voltage signal is provided to the first terminal of the light emitting element L, to reset the light emitting element L, so that the influence of light emission for the previous frame on light emission for the current frame is avoided. In the T1, T2 and T4 stages, With Scan3_4=1, the eight transistor M8 is switched off, the operating processes for the remaining transistors may basically the same as the operating processes for respective transistors during T1-T4 stages in the second example, and no repeated description thereof is given.

It can be found from the eleventh example that the potential of the signal Scan3_4 of the third scan signal terminal Scan3 is the same as that of the signal of the second control signal terminal CS2, therefore, the operating process of the pixel circuit as shown in FIG. 5D and in a case that the third scan signal terminal and the second control signal terminal are the same terminal may follow the operating process of the pixel circuit according to the eleventh example, and no repeated description thereof will be given below.

TWELFTH EXAMPLE

Taking the pixel circuit shown FIG. 5D as an example, the corresponding input timing diagram is shown in FIG. 6D. There are four stages T1, T2, T3 and T4 in the input timing diagram shown in FIG. 6D as an example. Moreover, Scan3_5 in FIG. 6D stands for the signal of the third scan signal terminal Scan3 in the pixel circuit shown in FIG. 5D.

In the T1-T3 stages, With Scan3_5=0, the eighth transistor M8 is switched on and a reference voltage signal is provided to the first terminal of the light emitting element L, to reset the light emitting element L, so that the influence of light emission for the previous frame on light emission for the current frame is avoided. In the T4 stage, With Scan3_5=1, the eight transistor M8 is switched off, the operating processes for the remaining transistors may basically the same as the operating processes for respective transistors during T1-T4 stages in the second example, and no repeated description thereof is given.

It can be found from the twelfth example that the potential of the signal Scan3_5 of the third scan signal terminal Scan3 is opposite to the potential of the signal of the light emitting control terminal EMIT, therefore, the operating process of the pixel circuit shown in FIG. 5D and in a case that the third scan signal terminal and the light emitting control signal terminal are the same terminal (as shown in FIG. 5H) may follow the operating process of the pixel circuit according to the twelfth example, and no repeated description thereof will be given below.

Figure 7:
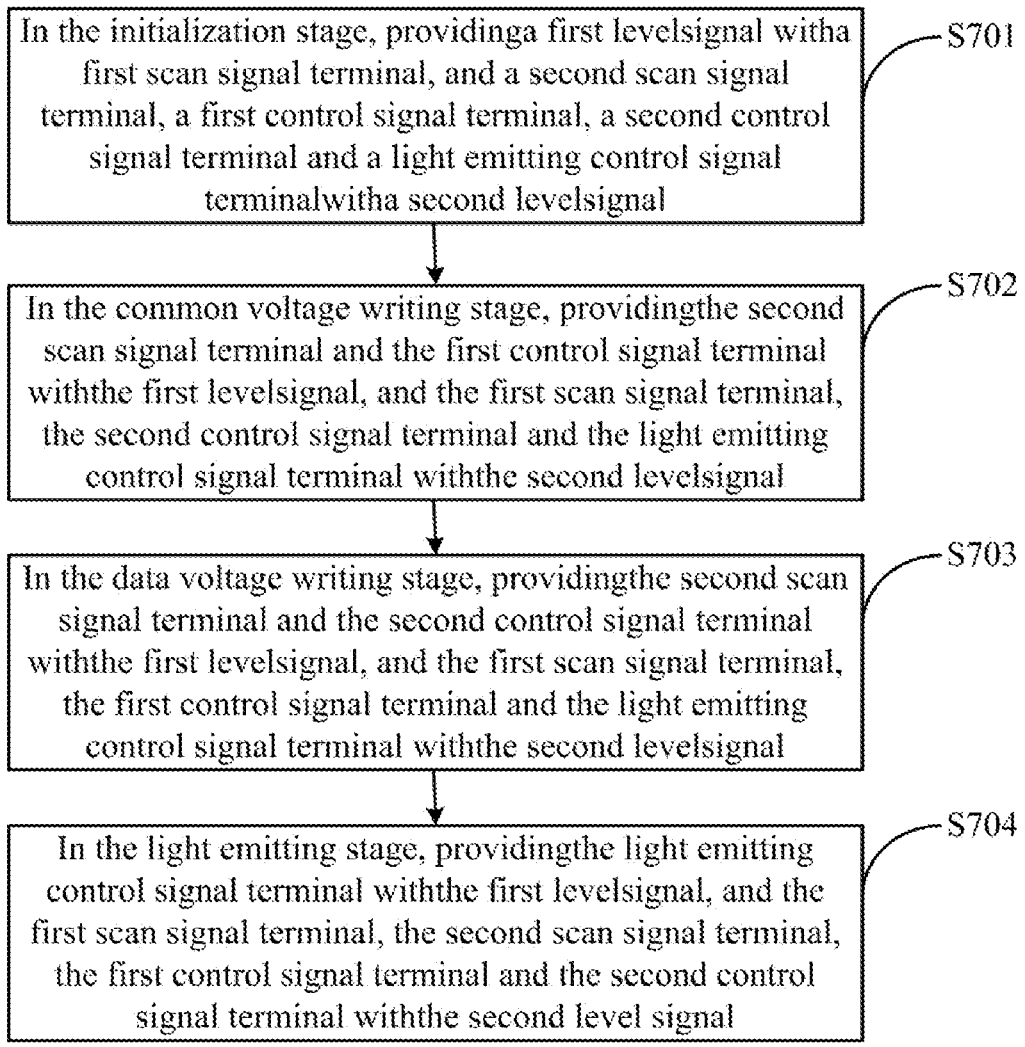
FIG. 7 shows a flow chart of a driving method according to an embodiment of the present disclosure.

Based on the same invention idea, an embodiment of the present disclosure further provides a method for driving any of the above described pixel circuits according to the embodiments of the present disclosure, as shown in FIG. 7, the method includes an initialization stage, a common voltage writing stage, a data voltage writing stage and a light emitting stage.

S701: in the initialization stage, providing a first level signal with a first scan signal terminal, and a second scan signal terminal, a first control signal terminal, a second control signal terminal and a light emitting control signal terminal with a second level signal;

S702: in the common voltage writing stage, providing the second scan signal terminal and the first control signal terminal with the first level signal, and the first scan signal terminal, the second control signal terminal and the light emitting control signal terminal with the second level signal;

S703: in the data voltage writing stage, providing the second scan signal terminal and the second control signal terminal with the first level signal, and the first scan signal terminal, the first control signal terminal and the light emitting control signal terminal with the second level signal; and S704: in the light emitting stage, providing the light emitting control signal terminal with the first level signal, and the first scan signal terminal, the second scan signal terminal, the first control signal terminal and the second control signal terminal with the second level signal.

In a specific implementation, in a driving method according to an embodiment of the present disclosure, the first level signal is a low level signal, and the second level signal is a high level signal; alternatively, the first level signal is a high level signal, and the second level signal is a low level signal.

In a specific implementation, in a driving method according to an embodiment of the present disclosure, the time length of the common voltage stage and the data voltage writing stage may be the time length for which one row of pixels is scanned.

In a specific implementation, in a driving method according to an embodiment of the present disclosure, the pixel circuit further includes an anode resetting module. The driving method further includes: in the initialization stage, providing the third scan signal terminal with the first level signal. In the initialization stage, the first level signal is provided to the third scan signal terminal; and during the common voltage writing stage to the light emitting stage, the second level signal is provided to the third scan signal terminal.

Alternatively, in the case that the pixel circuit further includes an anode resetting module, the driving method further includes: in the common voltage writing stage, providing the third scan signal terminal with the first level signal. In the common voltage writing stage, the first level signal is provided to the third scan signal terminal; and in the initialization stage, the data voltage writing stage and the light emitting stage, the second level signal is provided to the third scan signal terminal.

Alternatively, in the case that the pixel circuit further includes an anode resetting module, the driving method further includes: in the data voltage writing stage, providing the third scan signal terminal with the first level signal. In the data voltage writing stage, the first level signal is provided to the third scan signal terminal; and in the initialization stage, the common voltage writing stage and the light emitting stage, the second level signal is provided to the third scan signal terminal.

Alternatively, in the case that the pixel circuit further includes an anode resetting module, the driving method further includes: in the common voltage writing stage and the data voltage writing stage, providing the third scan signal terminal with the first level signal. In the common voltage writing stage and the data voltage writing stage, the first level signal is provided to the third scan signal terminal; and in the initialization stage and the light emitting stage, the second level signal is provided to the third scan signal terminal.

Alternatively, in the case that the pixel circuit further includes an anode resetting module, the driving method further includes: during the initialization stage to the data voltage writing stage, providing the third scan signal terminal with the first level signal. During the initialization stage to the data voltage writing stage, the first level signal is provided to the third scan signal terminal; and in the light emitting stage, the second level signal is provided to the third scan signal terminal.

Figure 8:
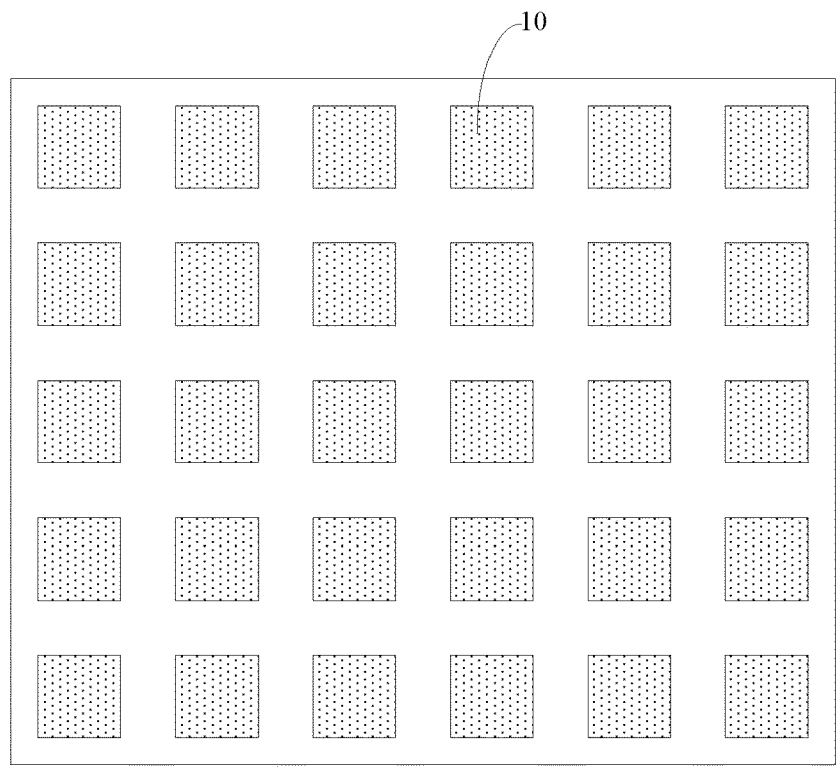
FIG. 8 shows a schematic scheme diagram of an organic light emitting display panel according to an embodiment of the present disclosure.

Based on the same invention idea, an embodiment of the present disclosure provides an organic light emitting display panel, as shown in FIG. 8. The organic light emitting display panel includes the pixel circuits 10 according to any of the above embodiments of the present disclosure. The principle of the organic light emitting display panel to solve the problems is similar as that of the forgoing pixel circuit, therefore, an implementation of the organic light emitting display panel may follow the implementation of the forgoing pixel circuit, and no repeated description thereof is given.

Based on the same invention idea, an embodiment of the present disclosure provides a display device. The display device includes any of the above described organic light emitting display panel according to the embodiments of the present disclosure. The display device may be a mobile phone, a tablet, a TV, a monitor, a laptop computer, a head-mounted video player, a head-mounted home theater, a head-mounted virtual reality simulator, a head-mounted game player, a pilot's helmet system, an individual soldier combat system, an infrared night-vision scope, a head-mounted medical diagnostic system, or any products or units which have display functions. Other necessary components for the display device should be known to those skilled in the art, and will not described herein and shall not be constructed as limitation to the invention. An implementation of the display device may follow the embodiments of the forgoing pixel circuit, and no repeated description thereof is given.

Figure 9:
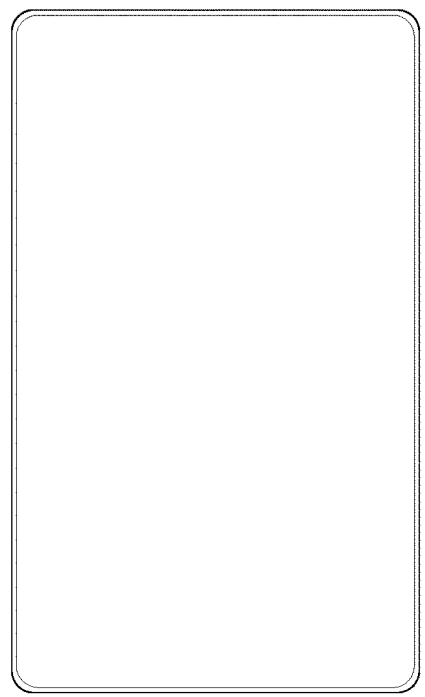
FIG. 9 shows a schematic scheme diagram of a display device according to an embodiment of the present disclosure.

In a specific implementation, if the display device according to the embodiments of the present disclosure is a mobile phone, as shown in FIG. 9, the mobile phone may be a full-screen mobile phone. Four corner portions of the displaying region of the full-screen mobile phone are arc-shaped, so that the area of the displaying region is increased and the displaying effect is improved. FIG. 9 only shows schematically the configuration of the displaying region of the mobile phone. In a practical application, there are a front-facing camera, an earpiece and other components further provided in the mobile phone, which should be known to those skilled in the art and no repeated description thereof is given. Of course, the mobile phone may be a mobile phone with other shape of display screen; for example, the four corner portions of the displaying region of the mobile phone are configured to be right-angle, and no limitation is made thereto.

In the pixel circuit and driving method thereof, the organic light emitting display panel and the display device according to the embodiments of the present disclosure, before the data signal is written into the control electrode of the driving transistor, a unified common voltage signal is input to the first electrode of the driving transistor, and the common voltage signal along with a threshold voltage of the driving transistor are written into the control electrode of the driving transistor. It can be ensured that each time the data signal is written to the control electrode of the driving transistor, voltages of the control electrode and the first electrode of the driving transistor can jump by a unified potential, so as to avoid the variation of the voltage change of the control electrode resulting from the parasitic capacitance between the control electrode and the first electrode of the driving transistor, thus the problem of the inconformity of threshold voltage captures due to the voltage jump can be avoided and therefore consistent brightness in the first frame after switching between high and low gray scales can be guaranteed. Furthermore, each time before the data signal is written to the control electrode of the driving transistor, the threshold voltage can be captured at the control electrode of the driving transistor, to thereby reduce the writing time of the data signal. Furthermore, during the process that the common voltage signal is written to the control electrode of the driving transistor, a large current can pass through the driving transistor, so as to correct the threshold voltage shift of the driving transistor due to the bias stress, alleviate the hysteresis effect of the driving transistor and thus avoid the occurrence of the ghosting image.

Obviously, those skilled in the art can make various modifications and variations to the present disclosure without departing from the spirit and scope of the present disclosure. Thus, if these modifications and variations of the present invention fall within the claims of the present disclosure and the scope of equivalents thereof, the present disclosure is intended to include these modifications and variations.

What is claimed is:

1. A pixel circuit, comprising:
a voltage writing module;
an initialization module;
a compensation control module;
a light emitting control module;
a driving transistor; and
a light emitting element;
wherein the voltage writing module is connected to a first control signal terminal, a second control signal terminal, a common voltage signal terminal, a data signal terminal and a first electrode of the driving transistor respectively, and is configured to provide a common voltage signal from the common voltage signal terminal to the first electrode of the driving transistor, under control of a signal of the first control signal terminal, to provide a data signal from the data signal terminal to the first electrode of the driving transistor under control of a signal of the second control signal terminal, wherein a voltage of the data signal is not less than that of the common voltage signal;
wherein the initialization module is connected to a first scan signal terminal, a reference signal terminal and the driving transistor respectively, and is configured to initialize the driving transistor under control of a signal of the first scan signal terminal;
wherein the compensation control module is connected to a second scan signal terminal, a control electrode of the driving transistor, and a second electrode of the driving transistor respectively, and is configured to connect the control electrode of the driving transistor to the second electrode of the driving transistor under control of a signal of the second scan signal terminal; and
wherein the light emitting control module is connected to a light emitting control signal terminal, a first power supply terminal, a first electrode of the driving transistor, a second electrode of the driving transistor and a first terminal of the light emitting element respectively, and is configured to drive the light emitting element through the driving transistor under control of a signal of the light emitting control signal terminal.

2. The pixel circuit according to claim 1, wherein the voltage writing module comprises a first transistor and a second transistor;
wherein the first transistor has a control electrode connected to the first control signal terminal, and wherein a first electrode connected to the common voltage signal terminal, and wherein a second electrode connected to the first electrode of the driving transistor; and
wherein the second transistor has a control electrode connected to the second control signal terminal, wherein a first electrode is connected to the data signal terminal, and wherein a second electrode connected to the first electrode of the driving transistor.

3. The pixel circuit according to claim 2, wherein the first control signal terminal and the second control signal terminal share a same signal terminal; and
wherein the first transistor is a P-type transistor, the second transistor is a N-type transistor; or
wherein the first transistor is a N-type transistor, the second transistor is a P-type transistor.

4. The pixel circuit according to claim 3, wherein the voltage writing module further comprises a third transistor; and wherein the second electrode of the second transistor is connected to the first electrode of the driving transistor via the third transistor; and
wherein the third transistor comprises a control electrode connected to the second scan signal terminal, a first electrode connected to the second electrode of the second transistor, and a second electrode connected to the first electrode of the driving transistor.

5. The pixel circuit according to claim 1, wherein the initialization module comprises a fourth transistor;
wherein the fourth transistor comprises a control electrode connected to the first scan signal terminal, a first electrode connected to the reference signal terminal, and a second electrode connected to the control electrode of the driving transistor.

6. The pixel circuit according to claim 5, wherein the fourth transistor is in a double-gate structure, wherein the fourth transistor comprises a first sub-transistor and a second sub-transistor connected in series; and wherein a connection node between the first sub-transistor and the second sub-transistor is connected to the first electrode of the driving transistor.

7. The pixel circuit according to claim 1, wherein the compensation control module comprises a fifth transistor and a storage capacitor;
wherein the fifth transistor comprises a control electrode connected to the second scan signal terminal, a first electrode connected to the control electrode of the driving transistor, and a second electrode connected to the second electrode of the driving transistor; and
wherein the storage capacitor has a first terminal connected to the first power supply terminal and a second terminal connected to the control electrode of the driving transistor.

8. The pixel circuit according to claim 7, wherein the fifth transistor is in a double-gate structure, which comprises a third sub-transistor and a fourth sub-transistor connected in series.

9. The pixel circuit according to claim 1, wherein the light emitting control module comprises a sixth transistor and a seventh transistor;

wherein the sixth transistor comprises a control electrode connected to the light emitting control signal terminal, a first electrode connected to the first power supply terminal, and wherein a second electrode is connected to the first electrode of the driving transistor; and wherein the seventh transistor comprises a control electrode connected to the light emitting control signal terminal, a first electrode connected to the second electrode of the driving transistor, and a second electrode connected to the first terminal of the light emitting element.

10. The pixel circuit according to claim 1, wherein the pixel circuit further comprises an anode resetting module;

wherein the anode resetting module is connected to a third scan signal terminal, the reference signal terminal and a first terminal of the light emitting element, and is configured to reset the first terminal of the light emitting element under control of a signal of the third scan signal terminal.

11. The pixel circuit according to claim 10, wherein the anode resetting module comprises an eighth transistor;

wherein the eighth transistor comprises a control electrode connected to the third scan signal terminal, a first electrode connected to the reference signal terminal, a second electrode connected to the first terminal of the light emitting element.

12. The pixel circuit according to claim 10, wherein:

the third scan signal terminal and the first scan signal terminal share a same signal terminal; or the third scan signal terminal and the second scan signal terminal share a same signal terminal; or the third scan signal terminal and the first control signal terminal share a same signal terminal; or the third scan signal terminal and the second control signal terminal share a same signal terminal; or the third scan signal terminal and the light emitting control signal terminal share a same signal terminal.

13. An organic light emitting display panel, comprising the pixel circuit according to claim 1.

14. A display device, comprising the organic light emitting display panel according to claim 13.

15. A method for driving the pixel circuit according to claim 1, comprising:

an initialization stage, a common voltage writing stage, a data voltage writing stage and a light emitting stage;

wherein in the initialization stage, providing the first scan signal terminal with a first level signal, and providing the second scan signal terminal, the first control signal terminal, the second control signal terminal and the light emitting control signal terminal with a second level signal;

wherein in the common voltage writing stage, providing the second scan signal terminal and the first control signal terminal with the first level signal, and providing the first scan signal terminal, the second control signal terminal and the light emitting control signal terminal with the second level signal;

wherein in the data voltage writing stage, providing the second scan signal terminal and the second control signal terminal with the first level signal, and providing the first scan signal terminal, the first control signal terminal and the light emitting control signal terminal with the second level signal; and wherein in the light emitting stage, providing the light emitting control signal terminal with the first level signal, and providing the first scan signal terminal, the second scan signal terminal, the first control signal terminal and the second control signal terminal with the second level signal.

16. The method according to claim 15, wherein the pixel circuit further comprises an anode resetting module; wherein the driving method further comprises:

in the initialization stage, providing the third scan signal terminal with the first level signal; or in the common voltage writing stage, providing the third scan signal terminal with the first level signal; or in the data voltage writing stage, providing the third scan signal terminal with the first level signal; or in the common voltage writing stage and the data voltage writing stage, providing the third scan signal terminal with the first level signal; or during the initialization stage to the data voltage writing stage, providing the third scan signal terminal with the first level signal.

\* \* \* \* \*